(12) United States Patent
Yamazaki et al.

(10) Patent No.: US 9,159,840 B2
(45) Date of Patent: Oct. 13, 2015

(54) SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Setagaya (JP); Atsuo Isobe, Isehara (JP); Toshinari Sasaki, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/456,330

(22) Filed: Aug. 11, 2014

(65) Prior Publication Data
US 2014/0346508 A1 Nov. 27, 2014

Related U.S. Application Data

(63) Continuation of application No. 13/613,178, filed on Sep. 13, 2012, now Pat. No. 8,822,989.

(30) Foreign Application Priority Data

Sep. 22, 2011 (JP) ................................. 2011-207429

(51) Int. Cl.
*H01L 29/786* (2006.01)
*H01L 27/12* (2006.01)
(Continued)

(52) U.S. Cl.
CPC ............ *H01L 29/7869* (2013.01); *H01L 27/12* (2013.01); *H01L 27/1225* (2013.01); *H01L 29/10* (2013.01); *H01L 29/41733* (2013.01); *H01L 29/41775* (2013.01)

(58) Field of Classification Search
CPC ............... H01L 29/7869; H01L 29/10; H01L 29/66742; H01L 29/78696; H01L 29/78618; H01L 29/41733; H01L 29/4908; H01L 29/78603; H01L 29/78693; H01L 29/458; H01L 27/12; H01L 27/1225; H01L 27/1214; H01L 27/3244; H01L 27/3262; H01L 27/3265; H01L 21/02565; H01L 21/02631; H01L 21/02472; H01L 21/02485
See application file for complete search history.

(56) References Cited

U.S. PATENT DOCUMENTS 5,648,662 A * 7/1997 Zhang et al. .................... 257/59
5,731,856 A   3/1998 Kim et al.
(Continued)

FOREIGN PATENT DOCUMENTS

| CN | 102257621 A | 11/2011 |
| EP | 1737044 A | 12/2006 |

(Continued)

OTHER PUBLICATIONS

Kamiya.T et al., "Carrier transport properties and electronic structures of amorphous oxide semiconductors: the present status", Solid State Physics, Sep. 1, 2009, vol. 44, No. 9, pp. 621-633, Agne Gijutsu Center.

(Continued)

*Primary Examiner* — Brett Feeney
*Assistant Examiner* — Sophia Nguyen
(74) *Attorney, Agent, or Firm* — Eric J. Robinson; Robinson Intellectual Property Law Office, P.C.

(57) ABSTRACT

Provided is a semiconductor device including a transistor with large on-state current even when it is miniaturized. The transistor includes a pair of first conductive films over an insulating surface; a semiconductor film over the pair of first conductive films; a pair of second conductive films, with one of the pair of second conductive films and the other of the pair of second conductive films being connected to one of the pair of first conductive films and the other of the pair of first conductive films, respectively; an insulating film over the semiconductor film; and a third conductive film provided in a position overlapping with the semiconductor film over the insulating film. Further, over the semiconductor film, the third conductive film is interposed between the pair of second conductive films and away from the pair of second conductive films.

13 Claims, 12 Drawing Sheets

(51) Int. Cl.
*H01L 29/10* (2006.01)
*H01L 29/417* (2006.01)

(56) References Cited

U.S. PATENT DOCUMENTS

| | | | |
|---|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,183,099 B2 | 5/2012 | Sakata |
| 8,502,216 B2 | 8/2013 | Akimoto et al. |
| 8,822,989 B2 * | 9/2014 | Yamazaki et al. | ............... 257/43 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0117075 A1 | 5/2010 | Akimoto et al. |
| 2010/0117078 A1 | 5/2010 | Kuwabara et al. |
| 2010/0159639 A1 | 6/2010 | Sakata |
| 2010/0224872 A1 * | 9/2010 | Kimura | ........................... 257/43 |
| 2011/0085635 A1 | 4/2011 | Koyama |
| 2011/0273021 A1 | 11/2011 | Kimura et al. |
| 2011/0298027 A1 | 12/2011 | Isobe et al. |
| 2012/0001243 A1 | 1/2012 | Kato |
| 2012/0033510 A1 | 2/2012 | Nagatsuka et al. |
| 2012/0062305 A1 | 3/2012 | Lundell et al. |
| 2012/0223307 A1 | 9/2012 | Sakata |
| 2013/0082254 A1 * | 4/2013 | Yamazaki et al. | ............... 257/43 |
| 2013/0153889 A1 | 6/2013 | Yamazaki et al. |

FOREIGN PATENT DOCUMENTS

| | | | |
|---|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2010-166030 A | 7/2010 |
| KR | 2011-0104057 A | 9/2011 |
| WO | WO-2004/114391 | 12/2004 |
| WO | WO-2010/071034 | 6/2010 |

OTHER PUBLICATIONS

Invitation to pay additional fees (application No. PCT/JP2012/073004), International Searching Authority, dated Oct. 2, 2012.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

(56) References Cited

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Hayashi.R et al., "42.1: Invited Paper: Improved Amorphous In-Ga-Zn-O TFTs", SID Digest '08 : SID International Symposium Digest of Technical Papers, May 20, 2008, vol. 39, pp. 621-624.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Nakamura.M et al., "The phase relations in the In2O3-Ga2ZnO4-ZnO system at 1350°C", Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor", Science, May 23, 2003, vol. 300, No. 5623, pp. 1269-1272.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.
Osada.T et al., "15.2: Development of Driver-Integrated Panel using Amorphous In-Ga-Zn-Oxide TFT", SID Digest '09 : SID International Symposium Digest of Technical Papers, May 31, 2009, pp. 184-187.
Nomura.K et al., "Carrier transport in transparent oxide semiconductor with intrinsic structural randomness probe using single-crystalline InGaO3(ZnO)5 films", Appl. Phys. Lett. (Applied Physics Letters), Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3-In2O3-ZnO) TFT", SID Digest '08 : SID International Symposium Digest of Technical Papers, May 20, 2008, vol. 39, pp. 633-636.
Lee.J et al., "World'S Largest (15-Inch) XGA AMLCD Panel Using IGZO Oxide TFT", SID Digest '08 : SID Interntational Symposium Digest of Technical Papers, May 20, 2008, vol. 39, pp. 625-628.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K at al., "Ultra Low Power Consumption Technologies for Mobile TFT-LCDs ", IDW '02 : Proceedings of the 9th International Display Workshops, Dec. 4, 2002, pp. 295-298.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Fung.T et al., "2-D Numerical Simulation of High Performance Amorphous In-Ga-Zn-O TFTs for Flat Panel Displays", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOELD Display Driven by Indium-Gallium-Zinc Oxide TFTs Array", SID Digest '08 : SID International Symposium Digest of Technical Papers, May 20, 2008, vol. 39, No. 1, pp. 1-4.
Park.J at al., "High performance amorphous oxide thin film transistors with self-aligned top-gate structure", IEDM 09 : Technical Digest of International Electron Devices Meeting, Dec. 7, 2009, pp. 191-194.
Kurokawa.Y at al., "UHF RFCPUS on Flexible and Glass Substrates for Secure RFID Systems", Journal of Solid-State Circuits , 2008, vol. 43, No. 1, pp. 292-299.
Ohara.H at al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D at al, "Optical Studies of the Amorphous Liquid-Cholesteric Liquid Crystal Transition:The "Blue Phase"", Physics Letters, Sep. 10, 1973, vol. 45A, No. 2, pp. 115-116.
Cho.D et al., "21.2:AL and SN-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.
Sakata.J et al., "Development of 4.0-IN. AMOLED Display With Driver Circuit Using Amorphous In-Ga-Zn-Oxide TFTs", IDW '09 : Proceedings of the 16th International Display Workshops, 2009, pp. 689-692.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AM-OLED Driven by Peald Grown ZnO TFT", IMID '07 Digest, 2007, pp. 1249-1252.
Godo.H et al., "Temperature Dependence of Characteristics and Electronic Structure for Amorphous In-Ga-Zn-Oxide TFT", AM-FPD '09 Digest of Technical Papers, Jul. 1, 2009, pp. 41-44.
Osada.T et al., "Development of Driver-Integrated Panel Using Amorphous In-Ga-Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In-Ga-Zn-Oxide TFT", SID Digest '09 : SID International Symposium Digest of Technical Papers, May 31, 2009, pp. 1110-1112.
Ohara.H et al., "21.3:4.0 IN. QVGA AMOELD Display Using In-Ga-Zn-Oxide TFTs With a Novel Passivation Layer", SID Digest '09 : SID International Symposium Digest of Technical Papers, May 31, 2009, pp. 284-287.

(56) References Cited

OTHER PUBLICATIONS

Miyasaka.M, "Suftla Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED ", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,Y8FE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000°C", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 58, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B(Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

\* cited by examiner 104  101  107 103 106    102  105

104  101  103 107    102 105

104  101  107 103 106  102  105

104  101  103  107  102  105

104 103  101  110  107 103  106  111 102   103   105
                              120

101 110 112 120 102 113 111

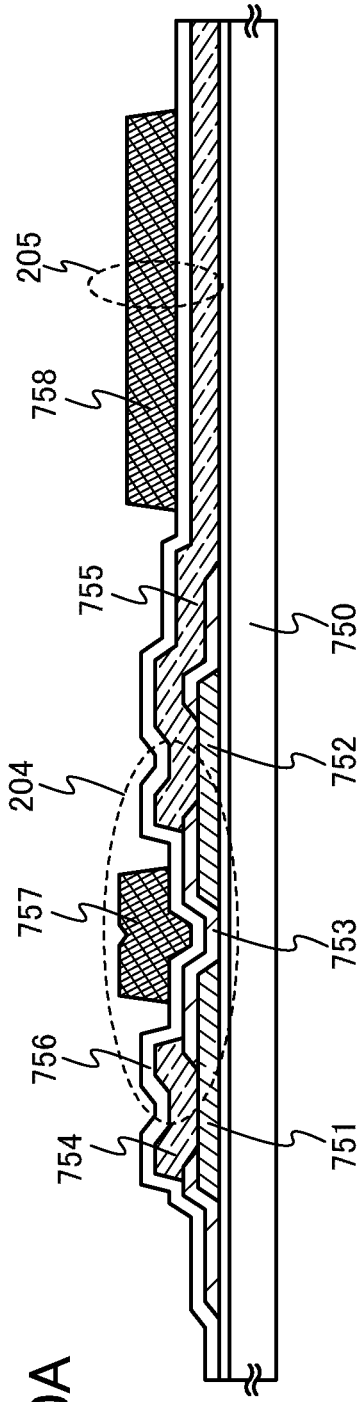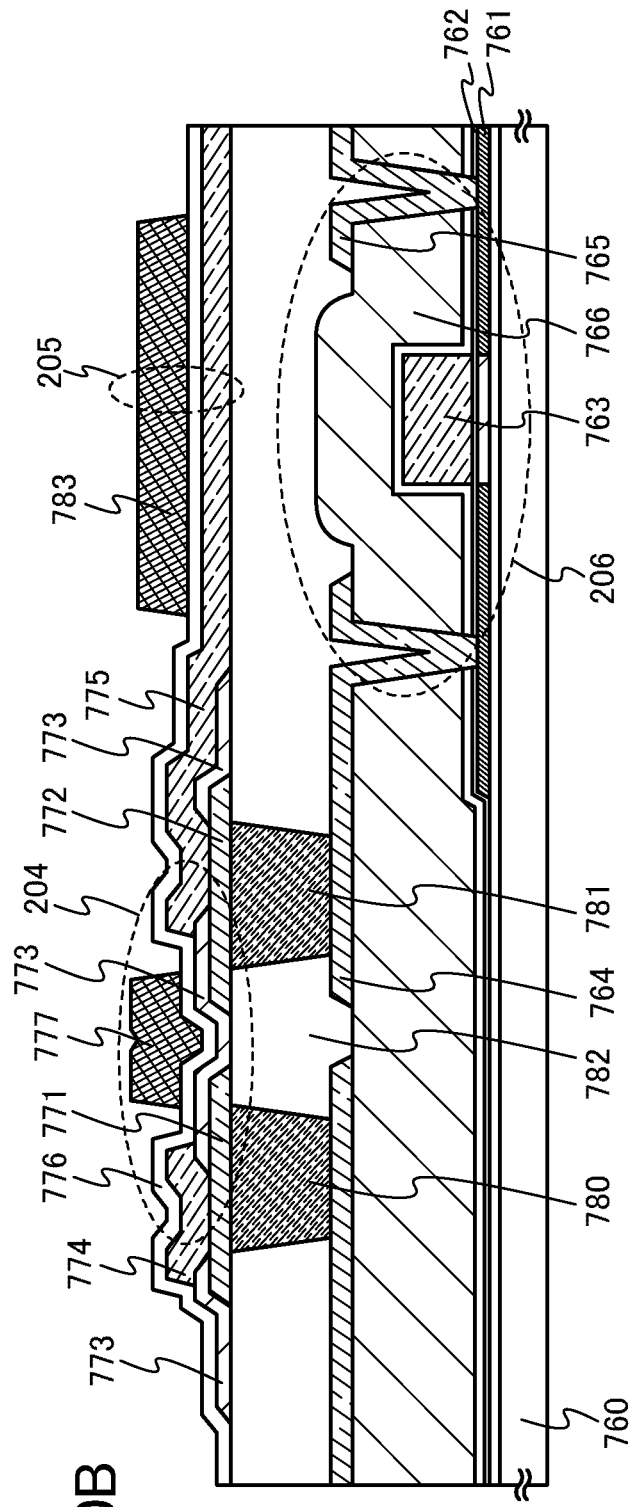

SEMICONDUCTOR DEVICE

TECHNICAL FIELD

The present invention relates to a semiconductor device using an insulated-gate field-effect transistor.

BACKGROUND ART

In recent years, a metal oxide having semiconductor characteristics, which is called an oxide semiconductor, has attracted attention as a novel semiconductor material having high mobility as in the case of polysilicon or microcrystalline silicon and having uniform element characteristics as in the case of amorphous silicon. The metal oxide is used for various applications. For example, indium oxide is a well-known metal oxide and used as a material of a transparent electrode included in a liquid crystal display device or the like. Examples of such metal oxides having semiconductor characteristics include tungsten oxide, tin oxide, indium oxide, and zinc oxide. Transistors in which a channel formation region is formed using such a metal oxide having semiconductor characteristics have been known (Patent Documents 1 and 2).

REFERENCE

Patent Documents

[Patent Document 1] Japanese Published Patent Application No. 2007-123861
[Patent Document 2] Japanese Published Patent Application No. 2007-096055

DISCLOSURE OF INVENTION

In a transistor formed using silicon, valence electrons are controlled by addition of a minute amount of impurity into a semiconductor film. However, in a transistor formed using an oxide semiconductor, unlike in the transistor formed using silicon, the technique of valence electron control with the addition of impurity has not been established yet. Accordingly, the transistor using an oxide semiconductor often has a structure such that a conductive film functioning as a source electrode or a drain electrode is directly connected to a channel formation region in a semiconductor film. Therefore, in the transistor formed using an oxide semiconductor, contact resistance between the semiconductor film and the source electrode or between the semiconductor film and the drain electrode is high; thus, an increase in on-state current is inhibited.

Further, in the transistor formed using silicon, with addition of impurity into the semiconductor film by using a gate electrode or a resist as a mask, a source region and a drain region are formed. Thus, by adjusting the size of the gate electrode or resist, the channel length can be controlled. In contrast, in the transistor formed using an oxide semiconductor, the channel length is controlled by adjustment of a gap between the source electrode and the drain electrode. Therefore, in order to miniaturize the transistor, the gap between the source electrode and the drain electrode needs to be short, and depending on the size of the gate electrode, the gate electrode can partly overlap with the source electrode or the drain electrode.

In the case of a top-gate transistor in which a gate electrode is located over a semiconductor film, a source electrode and a drain electrode are preferably provided below the semiconductor film. In order to ensure the coverage (step coverage) with the semiconductor film in end portions of the source electrode and the drain electrode, the thickness of the source electrode and the drain electrode needs to be small; however, as the thickness is decreased, the resistance of the source electrode and the drain electrode increases. Therefore, ensuring the step coverage makes it difficult to increase the on-state current of the transistor.

In view of the above-described technical background, an object of one embodiment of the invention is to provide a semiconductor device that can increase the on-state current of a transistor.

In a semiconductor device according to one embodiment of the invention, a transistor includes a pair of first conductive films over an insulating surface; a semiconductor film over the pair of first conductive films; a pair of second conductive films, with one of the pair of second conductive films and the other of the pair of second conductive films being connected to one of the pair of first conductive films and the other of the pair of first conductive films, respectively; an insulating film over the semiconductor film; and a third conductive film provided in a position overlapping with the semiconductor film over the insulating film. The pair of first conductive films and the pair of second conductive films can function as a source electrode and a drain electrode, and the third conductive film can function as a gate electrode.

According to one embodiment of the invention, the gap between the source electrode and the drain electrode in a direction in which carriers transfer in the semiconductor film, i.e., the channel length direction, can be determined by the gap between the pair of first conductive films. Accordingly, the pair of second conductive films can be positioned such that the gap between the pair of second conductive films is longer than that between the pair of first conductive films. Therefore, according to one embodiment of the invention, in the case where the gap between the source electrode and the drain electrode needs to be short in order to miniaturize the transistor, the gap between the pair of first conductive films may be short, and the gap between the pair of second conductive films can be long so that the pair of second conductive films does not overlap with the third conductive film over the semiconductor film. Specifically, over the semiconductor film, the third conductive film can be interposed between the pair of second conductive films and be away from the pair of second conductive films. Accordingly, even when the transistor is miniaturized, an electric field applied to the semiconductor film from the third conductive film is unlikely to be interrupted by the pair of second conductive films, resulting in large on-state current.

Further, according to one embodiment of the invention, the pair of first conductive films exists below the semiconductor film, and the third conductive film exists over the semiconductor film. Accordingly, even when the third conductive film functioning as the gate electrode overlaps with the pair of first conductive films owing to miniaturization of the transistor with the gap between the pair of first conductive films being short, the electric field applied to the semiconductor film from the third conductive film is unlikely to be interrupted by the pair of first conductive films. As a result, even when the transistor is miniaturized, large on-state current can be obtained.

Further, even when the thickness of each of the pair of first conductive films is made small in order to enhance the step coverage with the semiconductor film in end portions of the pair of first conductive films, the resistance of the source electrode and the drain electrode, which are formed using the pair of first conductive films and the pair of second conductive films, can be suppressed to be low because one of the pair of first conductive films and the other of the pair of first conductive films are connected to one of the pair of second conductive films and the other of the pair of second conductive films, respectively.

Alternatively, in the above structure of the semiconductor device according to one embodiment of the invention, the pair of second conductive films may be located over the semiconductor film.

In the case where the pair of second conductive films is located over the semiconductor film, the pair of first conductive films and the pair of second conductive films which function as the source electrode and the drain electrode can have a larger area that is in contact with the semiconductor film than in the case where the pair of second conductive films is away from the semiconductor film. Accordingly, even when the transistor is miniaturized, the contact resistance between the semiconductor film and source electrode and the drain electrode which are formed using the pair of first conductive films and the pair of second conductive films can be suppressed to be low, resulting in large on-state current.

According to one embodiment of the invention, any of the above-described structures can achieve a semiconductor device including a transistor with large on-state current.

BRIEF DESCRIPTION OF DRAWINGS

FIGS. 10A and 10B each illustrate a structure of a memory device.

BEST MODE FOR CARRYING OUT THE INVENTION

Hereinafter, embodiments of the invention will be described in detail with reference to the accompanying drawings. However, the invention is not limited to the following description and it is easily understood by those skilled in the art that the mode and details can be variously changed without departing from the scope and spirit of the invention. Accordingly, the invention should not be construed as being limited to the description of the embodiments below.

Note that the invention includes, in its category, all the semiconductor devices in which transistors are used: for example, integrated circuits, RF tags, and semiconductor display devices. The integrated circuits include, in its category, large scale integrated circuits (LSIs) including a microprocessor, an image processing circuit, a digital signal processor (DSP), a microcontroller, and the like, and programmable logic devices (PLDs) such as a field programmable gate array (FPGA) and a complex PLD (CPLD). In addition, the semiconductor display devices include, in its category, liquid crystal display devices, light-emitting devices in which a light-emitting element typified by an organic light-emitting element (OLED) is provided for each pixel, electronic papers, digital micromirror devices (DMDs), plasma display panels (PDPs), field emission displays (FEDs), and other semiconductor display devices in which a transistor is included in a driver circuit.

(Embodiment 1)

Figure 1A:
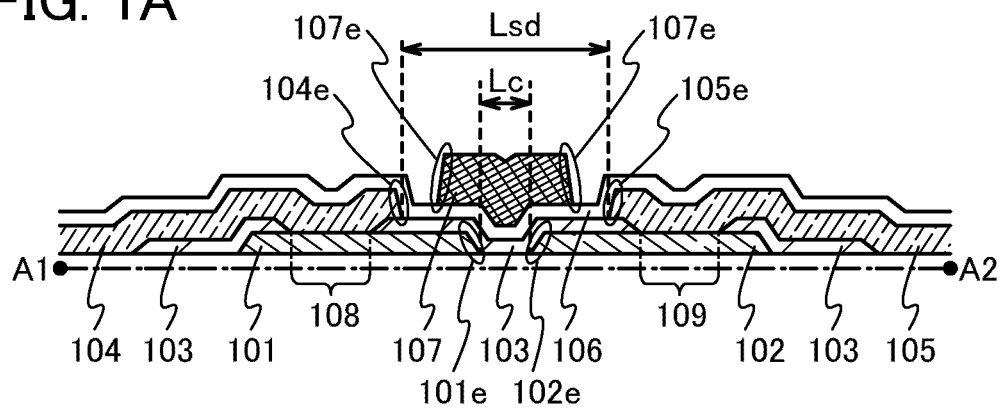
FIGS. 1A to 1C illustrate a structure of a transistor included in a semiconductor device according to one embodiment of the invention.
Figure 1B:
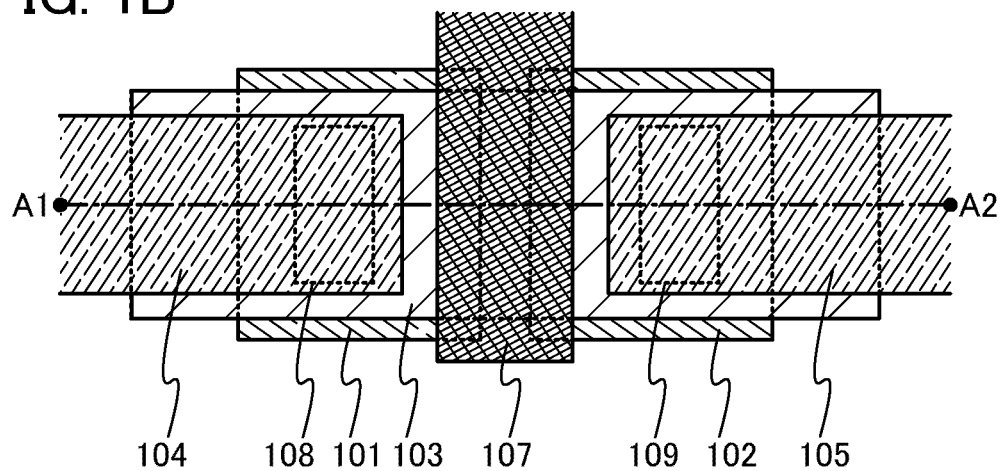
Figure 1C:
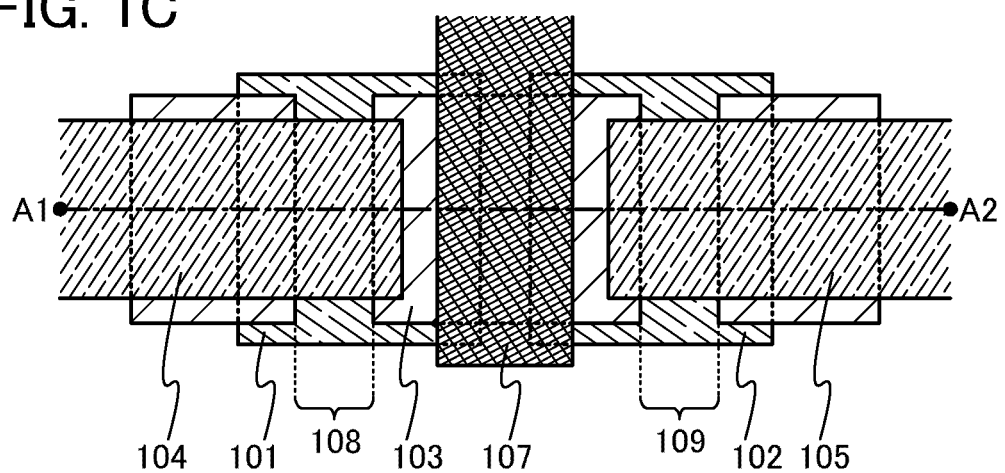

FIGS. 1A to 1C illustrate examples of a structure of a transistor included in a semiconductor device according to one embodiment of the invention. FIG. 1A is an example of a cross-sectional view of the transistor in the channel length direction.

The transistor in FIG. 1A includes, over an insulating surface, a first conductive film 101 and a first conductive film 102, a semiconductor film 103 over the first conductive film 101 and the first conductive film 102, a second conductive film 104 and a second conductive film 105 which are connected to the first conductive film 101 and the first conductive film 102, respectively, an insulating film 106 over the semiconductor film 103, and a third conductive film 107 provided in a position overlapping with the semiconductor film 103 over the insulating film 106 between the second conductive film 104 and the second conductive film 105.

The first conductive film 101 and the second conductive film 104 function as one of a source electrode and a drain electrode, and the first conductive film 102 and the second conductive film 105 function as the other of the source electrode and the drain electrode. The third conductive film 107 functions as a gate electrode.

The semiconductor film 103 covers each of the first conductive films 101 and 102 not completely but partly. The first conductive films 101 and 102 each has a portion that is not covered with the semiconductor film 103, that is, a portion that does not overlap with the semiconductor film 103, and the first conductive film 101 and the first conductive film 102 are connected to the second conductive film 104 and the second conductive film 105, respectively, therein.

Note that the connections between the first conductive film 101 and the second conductive film 104 and between the first conductive film 102 and the second conductive film 105 do not necessarily mean that the first conductive film 101 is in direct contact with the second conductive film 104 or that the first conductive film 102 is in direct contact with the second conductive film 105. For example, an insulating film, such as a natural oxide film, which has such a small thickness that enables electrical connection, may be formed between the first conductive film 101 and the second conductive film 104 or between the first conductive film 102 and the second conductive film 105.

According to one embodiment of the invention, over the semiconductor film 103, end portions 107e of the third conductive film 107 are interposed between the second conductive films 104 and 105 and are away from the second conductive films 104 and 105. That is, the second conductive films 104 and 105 do not overlap with the third conductive film 107 over the semiconductor film 103.

In the channel length direction, between an end portion 104e of the second conductive film 104 and an end portion 105e of the second conductive film 105, below the semiconductor film 103, an end portion 101e of the first conductive film 101 and an end portion 102e of the first conductive film 102 are located. Note that the end portions 101e and 102e refer to the closest end portions of the first conductive films 101 and 102 in the channel length direction. Therefore in the channel length direction, a gap $L_{sd}$ between the end portion 104e of the second conductive film 104 and the end portion 105e of the second conductive film 105 is longer than a gap $L_c$ between the end portion 101e of the first conductive film 101 and the end portion 102e of the first conductive film 102.

According to one embodiment of the invention, the semiconductor film 103 and the insulating film 106 are located between the first conductive film 101 functioning as one of the source electrode and the drain electrode and the third conductive film 107 functioning as the gate electrode, and between the first conductive film 102 functioning as the other of the source electrode and the drain electrode and the third conductive film 107 functioning as the gate electrode. Therefore, unlike when the first conductive films 101 and 102 are provided between the third conductive film 107 and the semiconductor film 103, even when the gap $L_c$ becomes short owing to miniaturization of the transistor, the electric field applied to the semiconductor film 103 from the third conductive film 107 is unlikely to be interrupted by the first conductive films 101 and 102. Accordingly, even when the transistor is miniaturized, large on-state current can be obtained.

Further, even when the thickness of each of the first conductive films 101 and 102 is made small in order to enhance the step coverage with the semiconductor film 103 in the end portions 101e and 102e of the first conductive films 101 and 102, the resistance of the source electrode and the drain electrode, which are formed using the first conductive films 101 and 102 and the second conductive films 104 and 105, can be suppressed to be low because the first conductive film 101 and the first conductive film 102 are connected to the second conductive film 104 and the second conductive film 105, respectively.

Next, an example of a top view of the transistor having the cross-sectional structure in FIG. 1A is illustrated in FIG. 1B. Note that the insulating film 106 is omitted in FIG. 1B for a simple layout of the transistor. A cross-sectional view along dash-dotted line A1-A2 in FIG. 1B corresponds to FIG. 1A.

In the top view in FIG. 1B, the semiconductor film 103 has openings 108 and 109. The first conductive film 101 is connected to the second conductive film 104 in the opening 108, whereas the first conductive film 102 is connected to the second conductive film 105 in the opening 109.

Another example of a top view of the transistor having the cross-sectional structure in FIG. 1A is illustrated in FIG. 1C. Note that the insulating film 106 is omitted in FIG. 1C for a simple layout of the transistor. A cross-sectional view along dash-dotted line A1-A2 in FIG. 1C corresponds to FIG. 1A.

In the top view in FIG. 1C, the semiconductor film 103 is divided into three parts. Gaps between the three parts of the semiconductor film 103 correspond to the openings 108 and 109. The first conductive film 101 is connected to the second conductive film 104 in the opening 108, whereas the first conductive film 102 is connected to the second conductive film 105 in the opening 109.

In the transistor illustrated in FIGS. 1A to 1C, the second conductive films 104 and 105 are connected to the first conductive films 101 and 102, respectively, in only top surfaces of the first conductive films 101 and 102. However, according to one embodiment of the invention, the second conductive films 104 and 105 may be connected to the first conductive films 101 and 102, respectively, in both the top surfaces and end portions of the first conductive films 101 and 102.

Figure 2A:
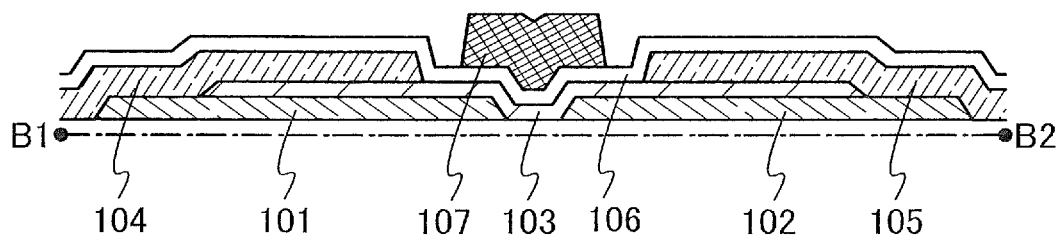
FIGS. 2A and 2B illustrate a structure of a transistor included in a semiconductor device according to one embodiment of the invention.
Figure 2B:
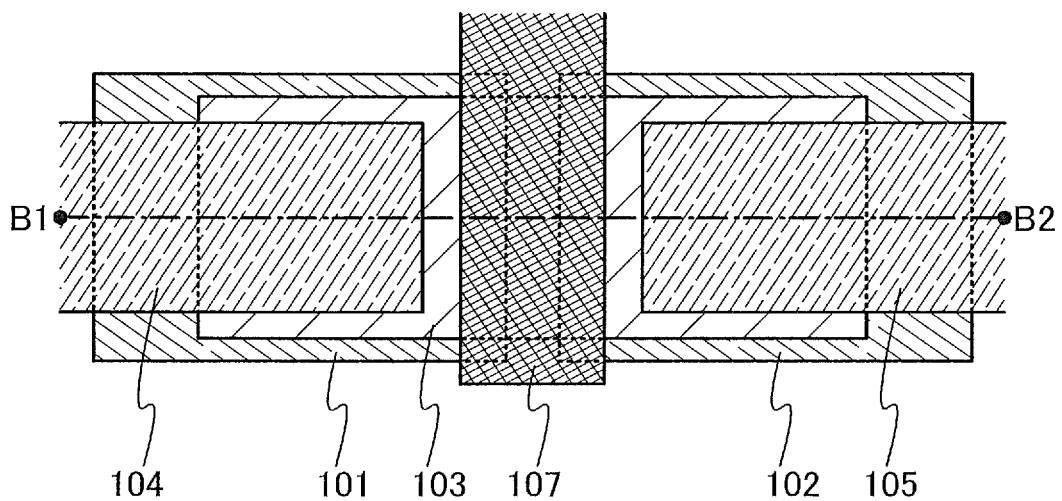

FIGS. 2A and 2B illustrate another example of the structure of the transistor included in the semiconductor device according to one embodiment of the invention. FIG. 2A is an example of a cross-sectional view of the transistor. Further, FIG. 2B is an example of a top view of the transistor having the cross-sectional structure in FIG. 2A. Note that the insulating film 106 is omitted in FIG. 2B for a simple layout of the transistor. A cross-sectional view along dash-dotted line B1-B2 in FIG. 2B corresponds to FIG. 2A.

The transistor in FIGS. 2A and 2B includes, over an insulating surface, the first conductive film 101 and the first conductive film 102, the semiconductor film 103 over the first conductive film 101 and the first conductive film 102, the second conductive film 104 and the second conductive film 105 which are connected to the first conductive film 101 and the first conductive film 102, respectively, over the semiconductor film 103, the insulating film 106 over the semiconductor film 103, and the third conductive film 107 provided in a position overlapping with the semiconductor film 103 over the insulating film 106.

The transistor in FIGS. 2A and 2B has a structure different from that of the transistor in FIGS. 1A to 1C in that the second conductive films 104 and 105 are connected to the first conductive films 101 and 102, respectively, not only in the top surface but also the end portion thereof. Accordingly, when the area of regions (occupation area) where the first conductive films 101 and 102 are provided over the insulating surface is the same in the transistor in FIGS. 1A to 1C and in the transistor in FIGS. 2A and 2B, the transistor in FIGS. 2A and 2B can ensure a larger area where the first conductive film 101, 102 is connected to the second conductive film 104, 105 than the transistor in FIGS. 1A to 1C owing to the above structure. Therefore, the contact resistance between the first conductive film 101 and the second conductive film 104 or the contact resistance between the first conductive film 102 and the second conductive film 105 can be reduced.

Note that FIGS. 1A to 1C and FIGS. 2A and 2B illustrate the examples where each of the second conductive films 104 and 105 is in contact with the semiconductor film 103. However, according to one embodiment of the invention, the second conductive film 104 or the second conductive film 105 may be away from the semiconductor film 103.

Figure 3A:
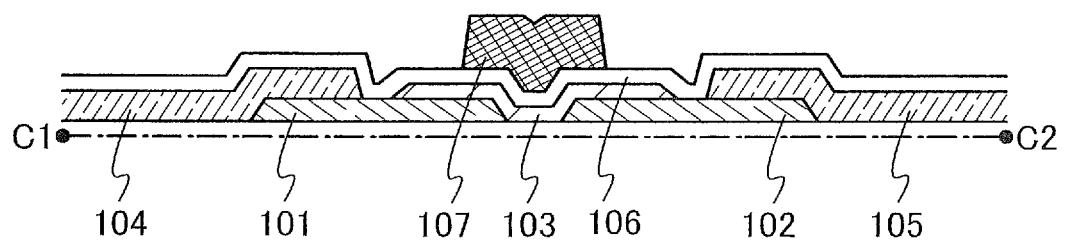
FIGS. 3A and 3B illustrate a structure of a transistor included in a semiconductor device according to one embodiment of the invention.
Figure 3B:
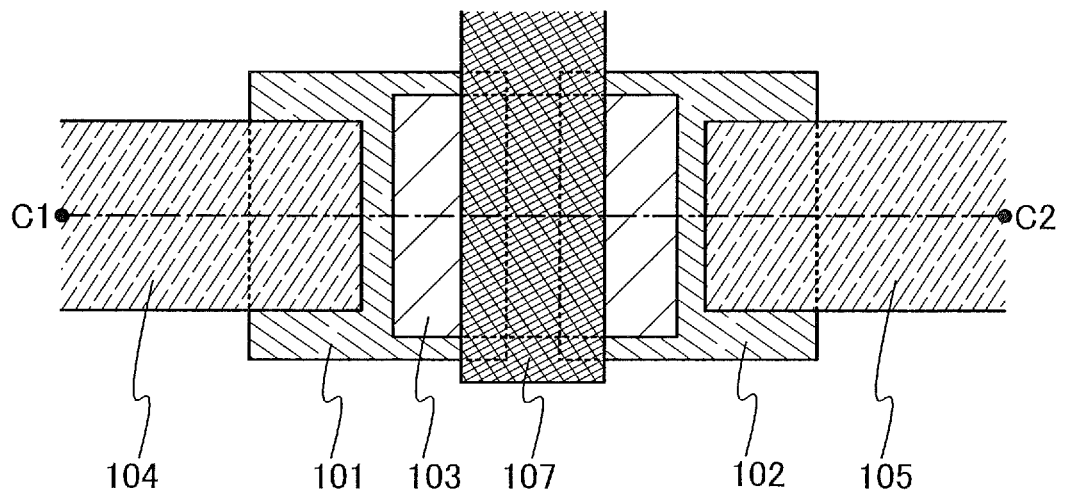

FIGS. 3A and 3B illustrate another example of the structure of the transistor included in the semiconductor device according to one embodiment of the invention. FIG. 3A is an example of a cross-sectional view of the transistor. Further, FIG. 3B is an example of a top view of the transistor having the cross-sectional structure in FIG. 3A. Note that the insulating film 106 is omitted in FIG. 3B for a simple layout of the transistor. A cross-sectional view along dash-dotted line C1-C2 in FIG. 3B corresponds to FIG. 3A.

The transistor in FIGS. 3A and 3B includes, over an insulating surface, the first conductive film 101 and the first conductive film 102, the semiconductor film 103 over the first conductive film 101 and the first conductive film 102, the second conductive film 104 and the second conductive film 105 which are connected to the first conductive film 101 and the first conductive film 102, respectively, away from the semiconductor film 103, the insulating film 106 over the semiconductor film 103, and the third conductive film 107 provided in a position overlapping with the semiconductor film 103 over the insulating film 106.

The transistor in FIGS. 3A and 3B has a structure different from that of the transistor in FIGS. 1A to 1C and that of the transistor in FIGS. 2A and 2B in that the second conductive films 104 and 105 are away from the semiconductor film 103.

In the case where each of the second conductive films 104 and 105 is in contact with the semiconductor film 103 as illustrated in FIGS. 1A to 1C and FIGS. 2A and 2B, the area where the semiconductor film 103 is in contact with the first conductive film 101 and the second conductive film 104, which function as one of the source electrode and the drain electrode, and the area where the semiconductor film 103 is in contact with the first conductive film 102 and the second conductive film 105, which function as the other of the source electrode and the drain electrode, can be larger than those in the case where the second conductive films 104 and 105 are away from the semiconductor film 103 as illustrated in FIGS. 3A and 3B. Accordingly, with the structure in which each of the second conductive films 104 and 105 is in contact with the semiconductor film 103, even when the transistor is miniaturized, the contact resistance between the first conductive film 101 and the semiconductor film 103 and between the second conductive film 104 and the semiconductor film 103, or the contact resistance between the first conductive film 102 and the semiconductor film 103 and between the second conductive film 105 and the semiconductor film 103 can be suppressed to be low, resulting in large on-state current.

Further, the transistor included in the semiconductor device according to one embodiment of the invention may further include a fourth conductive film below the first conductive film 101 or the first conductive film 102. Another example of a cross-sectional view of the transistor included in the semiconductor device according to one embodiment of the invention is illustrated in FIG. 4A.

Figure 4A:
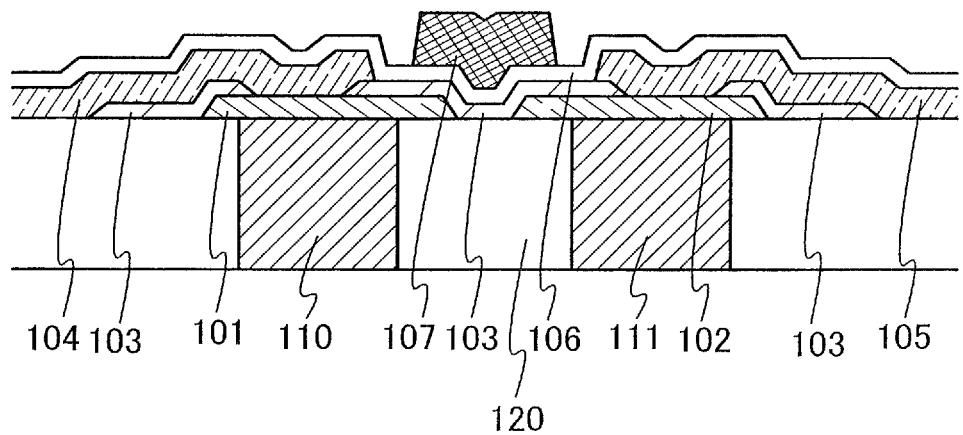
FIGS. 4A and 4B illustrate structures of a transistor included in a semiconductor device according to one embodiment of the invention.

The transistor in FIG. 4A has a structure such that a fourth conductive film 110 and a fourth conductive film 111 are added to the transistor having the cross-sectional structure in FIG. 1A. Specifically, the transistor in FIG. 4A includes the first conductive film 101 and the first conductive film 102, the semiconductor film 103 over the first conductive film 101 and the first conductive film 102, the second conductive film 104 and the second conductive film 105 which are connected to the first conductive film 101 and the first conductive film 102, respectively, a first insulating film 106 over the semiconductor film 103, and the third conductive film 107 provided in a position overlapping with the semiconductor film 103 over the first insulating film 106. The transistor further includes, below the first conductive films 101 and 102, the fourth conductive film 110 and the fourth conductive film 111 which are connected to the first conductive film 101 and the first conductive film 102, respectively, and a second insulating film 120 provided between the fourth conductive films 110 and 111. Top surfaces of the fourth conductive films 110 and 111 and the second insulating film 120 are preferably flattened by chemical mechanical polishing (CMP), etching, or the like.

The fourth conductive film 110 functions as one of the source electrode and the drain electrode of the transistor together with the first conductive film 101 and the second conductive film 104, and the fourth conductive film 111 functions as the other of the source electrode and the drain electrode of the transistor together with the first conductive film 102 and the second conductive film 105. With the addition of the fourth conductive films 110 and 111, the total resistance of the first conductive film 101, the second conductive film 104, and the fourth conductive film 110, which function as one of the source electrode and the drain electrode, and the total resistance of the first conductive film 102, the second conductive film 105, and the fourth conductive film 111, which function as the other of the source electrode and the drain electrode, can be suppressed to be low.

Note that a semiconductor film may be provided between the fourth conductive film 110 and the first conductive film 101 and between the fourth conductive film 111 and the first conductive film 102. Another example of a cross-sectional view of the transistor included in the semiconductor device according to one embodiment of the invention is illustrated in FIG. 4B.

Figure 4B:
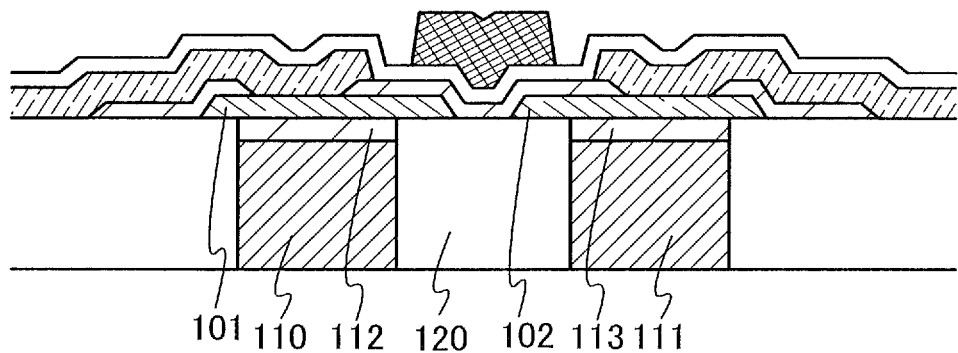

The transistor in FIG. 4B has a structure different from that of the transistor in FIG. 4A in that a semiconductor film 112 is provided between the first conductive film 101 and the fourth conductive film 110 and that a semiconductor film 113 is provided between the first conductive film 102 and the fourth conductive film 111.

Note that FIGS. 4A and 4B illustrate examples where the fourth conductive films are provided below the transistor having the cross-sectional structure in FIG. 1A; however, one embodiment of the invention is not limited to this structure. For example, the fourth conductive films may be provided below the transistor having the cross-sectional structure in FIG. 2A or FIG. 3A.

In the transistors in FIGS. 1A to 1C, FIGS. 2A and 2B, FIGS. 3A and 3B, and FIGS. 4A and 4B, the first conductive films 101 and 102 overlap with the third conductive film 107 with the semiconductor film 103 and the insulating film 106 (the first insulating film 106) interposed therebetween. However, according to one embodiment of the invention, the first conductive films 101 and 102 do not necessarily overlap with the third conductive film 107 with the semiconductor film 103 and the insulating film 106 (the first insulating film 106) interposed therebetween.

Figure 5A:
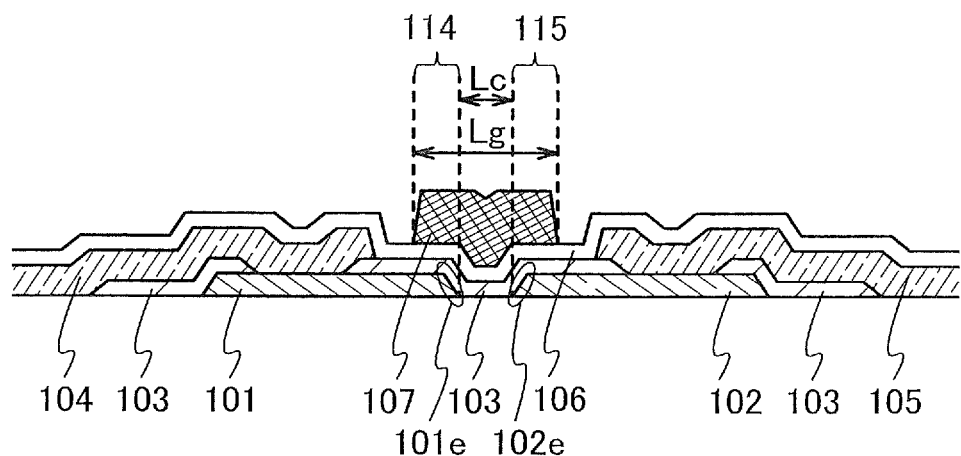
FIGS. 5A and 5B illustrate structures of a transistor included in a semiconductor device according to one embodiment of the invention.

With use of the cross-sectional structure of the transistor in FIG. 1A as an example, FIG. 5A illustrates a relation between the gap $L_c$ and a length $L_g$. Note that the gap $L_c$ is the length between the end portion 101e of the first conductive film 101 and the end portion 102e of the first conductive film 102, and the length $L_g$ is the length of the third conductive film 107 in the channel length direction. In FIG. 5A, the length $L_g$ is longer than the gap $L_c$. Further, the transistor in FIG. 5A has an $L_{ov}$ region 114 where the third conductive film 107 overlaps with the first conductive film 101 with the semiconductor film 103 and the insulating film 106 interposed therebetween, and an $L_{ov}$ region 115 where the third conductive film 107 overlaps with the first conductive film 102 with the semiconductor film 103 and the insulating film 106 interposed therebetween.

The provision of the $L_{ov}$ region 114 or the $L_{ov}$ region 115 leads to an increase in the on-state current of the transistor.

Figure 5B:
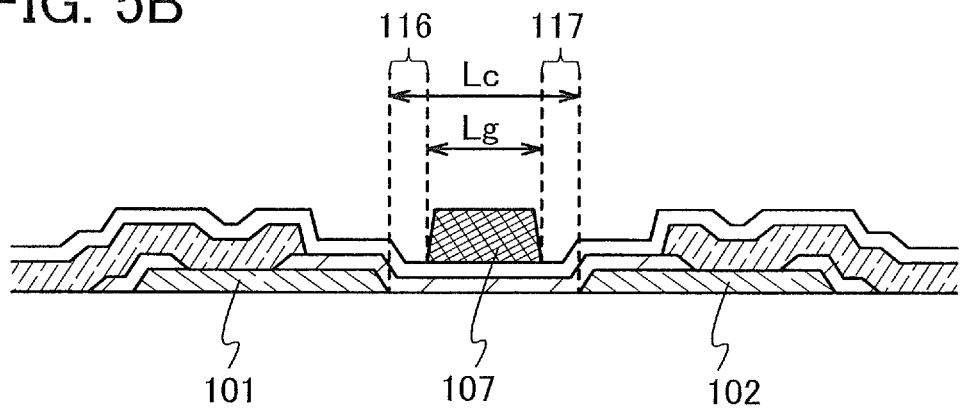

With use of the cross-sectional structure of the transistor in FIG. 1A as an example, FIG. 5B illustrates another relation between the gap $L_c$ and the length $L_g$. Note that the gap $L_c$ is the length between the end portion 101e of the first conductive film 101 and the end portion 102e of the first conductive film 102, and the length $L_g$ is the length of the third conductive film 107 in the channel length direction. In FIG. 5B, the length $L_g$ is shorter than the gap $L_c$. The transistor in FIG. 5B has an $L_{off}$ region 116 which corresponds to a region where, between the first conductive film 101 and the first conductive film 102, the third conductive film 107 does not overlap with the first conductive film 101, that is, a region that is different from the region where the third conductive film 107 and the first conductive film 101 are provided. The transistor in FIG. 5B also has an $L_{off}$ region 117 which corresponds to a region where, between the first conductive film 101 and the first conductive film 102, the third conductive film 107 does not overlap with the first conductive film 102, that is, a region that is different from the region where the third conductive film 107 and the first conductive film 102 are provided.

The provision of the $L_{off}$ region 116 or the $L_{off}$ region 117 leads to suppression of a parasitic capacitance between the first conductive films 101 and 102 and the third conductive film 107, resulting in higher operation speed of the transistor.

In the transistor included in the semiconductor device according to one embodiment of the invention, a wide band gap semiconductor such as an oxide semiconductor can be used for the semiconductor film 103. In the case where an oxide semiconductor is used for the semiconductor film 103, a dopant may be added to the semiconductor film 103 to form impurity regions functioning as a source region and a drain region. The dopant can be added by ion implantation. Examples of the dopant include a rare gas such as helium, argon, or xenon, a Group 15 element such as nitrogen, phosphorus, arsenic, or antimony, and the like. When nitrogen, for example, is used as the dopant, the concentration of nitrogen atoms in the impurity region is preferably higher than or equal to $5 \times 10^{19}/cm^3$ and lower than or equal to $1 \times 10^{22}/cm^3$.

Note that the oxide semiconductor preferably contains at least indium (In) or zinc (Zn), and further preferably contains In and Zn. In addition, the oxide semiconductor preferably contains gallium (Ga) as a stabilizer that reduces variations in electrical characteristics among transistors using such an oxide. Alternatively, tin (Sn) is preferably contained as a stabilizer. Further alternatively, hafnium (Hf) is preferably contained as a stabilizer. Further alternatively, aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, it is possible to use an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide. The above oxide semiconductor may contain silicon.

Note that, as an example, an In—Ga—Zn-based oxide means an oxide containing In, Ga, and Zn, and there is no limitation on the ratio of In, Ga, and Zn. Further, the In—Ga—Zn-based oxide may contain a metal element other than In, Ga, and Zn. Note that an In—Ga—Zn-based oxide has sufficiently high resistance when there is no electric field and thus the off-state current can be sufficiently reduced. In addition, also having high mobility, the In—Ga—Zn-based oxide is suitable for a semiconductor material used in a semiconductor device.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

High mobility can be obtained relatively easily in the case of using an In—Sn—Zn oxide, for example. However, mobility can be increased by reducing the defect density in a bulk also in the case of using an In—Ga—Zn-based oxide.

Note that a highly purified oxide semiconductor (purified oxide semiconductor) that is obtained by reduction of impurities such as moisture or hydrogen which serves as an electron donor (donor) and by reduction of oxygen vacancies is an i-type (intrinsic) semiconductor or a substantially i-type semiconductor. Therefore, a transistor formed using the oxide semiconductor has a characteristic of extremely small off-state current. Further, the band gap of the oxide semiconductor is 2 eV or more, preferably 2.5 eV or more, more preferably 3 eV or more. With use of an oxide semiconductor film which is highly purified by a sufficient decrease in the concentration of impurities such as moisture or hydrogen and a reduction of oxygen vacancies, the off-state current of a transistor can be decreased.

Specifically, various experiments can prove the small off-state current of a transistor in which a highly purified oxide semiconductor is used for a semiconductor film. Even when an element has a channel width of $1 \times 10^6$ μm and a channel length of 10 μm for example, the off-state current can be less than or equal to the measurement limit of a semiconductor parameter analyzer, i.e., less than or equal to $1 \times 10^{-13}$ A, at voltages (drain voltages) between the source electrode and the drain electrode of 1 V to 10 V. In this case, it can be seen that the off-state current corresponding to a value obtained by dividing the off-state current by the channel width of the transistor is 100 zA/μm or lower. In addition, a capacitor and a transistor are connected to each other and the off-state current is measured with a circuit in which charge flowing into or from the capacitor is controlled by the transistor. In the measurement, a highly purified oxide semiconductor film is used for a channel formation region of the transistor, and the off-state current of the transistor is measured from a change in the amount of charge of the capacitor per unit time. As a result, it is found that in the case where the voltage between the source electrode and the drain electrode of the transistor is 3 V, smaller off-state current of several tens of yoctoamperes per micrometer (yA/μm) can be obtained. Consequently, the transistor whose channel formation region is formed in a highly purified oxide semiconductor film has much smaller off-state current than a transistor formed using crystalline silicon.

Unless otherwise specified, in the case of an n-channel transistor, off-state current in this specification refers to current which flows between a source electrode and a drain electrode when a potential of the drain electrode is higher than that of the source electrode or that of a gate electrode while the potential of the gate electrode is less than or equal to zero when a reference potential is the potential of the source electrode. Alternatively, in the case of a p-channel transistor, off-state current in this specification refers to current which flows between a source electrode and a drain electrode when a potential of the drain electrode is lower than that of the source electrode or that of a gate electrode while the potential of the gate electrode is higher than or equal to zero when a reference potential is the potential of the source electrode.

Note that the oxide semiconductor film can be formed by a sputtering method using a target containing indium (In), gallium (Ga), and zinc (Zn), for example. In the case of forming an In—Ga—Zn-based oxide semiconductor film by a sputtering method, it is preferable to use a target of an In—Ga—Zn-based oxide having an atomic ratio of In:Ga:Zn=1:1:1, 4:2:3, 3:1:2, 1:1:2, 2:1:3, or 3:1:4. When an oxide semiconductor film is formed using a target of an In—Ga—Zn-based oxide having the above atomic ratio, a polycrystal or a CAAC (c-axis-aligned crystal) is easily formed. The filling factor of the target containing In, Ga, and Zn is 90% or higher and 100% or lower, and preferably 95% or higher and lower than 100%. With use of the target with a high filling factor, a dense oxide semiconductor film is formed.

In the case where an In—Zn-based oxide material is used as an oxide semiconductor, the atomic ratio of metal elements in a target to be used is In:Zn=50:1 to 1:2 ($In_2O_3$:ZnO=25:1 to 1:4 in a molar ratio), preferably In:Zn=20:1 to 1:1 ($In_2O_3$:ZnO=10:1 to 1:2 in a molar ratio), more preferably In:Zn=1.5:1 to 15:1 ($In_2O_3$:ZnO=3:4 to 15:2 in a mole ratio). In a target used for formation of an oxide semiconductor film containing an In—Zn-based oxide having an atomic ratio of In:Zn:O=X:Y:Z, for example, the relation of Z>1.5X+Y is satisfied. The mobility can be improved by keeping the ratio of Zn within the above range.

An oxide semiconductor film can be single crystal, polycrystalline (also referred to as polycrystal), or amorphous, for example.

Preferably, a CAAC-OS (c axis aligned crystalline oxide semiconductor) film can be used as the oxide semiconductor film.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes can be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of the c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, variations in electrical characteristics of the transistor due to irradiation with visible light or ultraviolet light can be reduced. Thus, the transistor has high reliability.

The CAAC-OS film is formed by, for example, a sputtering method using a polycrystalline oxide semiconductor sputtering target. When ions collide with the sputtering target, a crystal region included in the sputtering target can be separated from the target along an a-b plane; in other words, a sputtered particle having a plane parallel to an a-b plane (flat-plate-like sputtered particle or pellet-like sputtered particle) can flake off from the sputtering target. In this case, the flat-plate-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is 100° C. to 740° C., preferably 200° C. to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined molar ratio, applying pressure, and performing heat treatment at a temperature of 1000° C. to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

(Embodiment 2)

The semiconductor device according to one embodiment of the invention may have a structure in which transistors are stacked. In particular, a transistor having the structure in FIG. 4A can be used such that the fourth conductive film 110 or the fourth conductive film 111 functions as any of a gate electrode, a source electrode, and a drain electrode of a transistor in a lower layer. Accordingly, the semiconductor device can be miniaturized with an increase in element area due to contact area suppressed, or the number of steps for manufacturing the transistor can be reduced.

This embodiment shows a method of manufacturing the semiconductor device according to one embodiment of the invention, which has a structure in which a transistor is provided below the transistor having the structure in FIG. 4A, by taking a memory device which is one of semiconductor devices as an example.

First, in advance of the description of the manufacturing method, a structure of a memory cell included in the memory device is described.

Figure 9A:
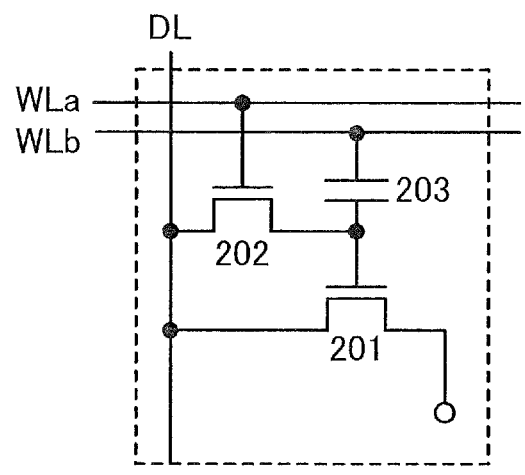
FIGS. 9A and 9B are diagrams each showing a configuration of a memory cell.

FIG. 9A illustrates a circuit diagram of a memory cell. The memory cell in FIG. 9A includes a transistor 201, a transistor 202, and a capacitor 203. A gate electrode of the transistor 202 is connected to a first word line WLa. One of a source electrode and a drain electrode of the transistor 202 is connected to a data line DL, and the other of the source electrode and the drain electrode thereof is connected to a gate electrode of the transistor 201. One of a source electrode and a drain electrode of the transistor 201 is connected to the data line DL, and the other of the source electrode and the drain electrode thereof is connected to a node to which a predetermined potential is given. As for a pair of electrodes of the capacitor 203, one of the electrodes is connected to the gate electrode of the transistor 201, and the other thereof is connected to a second word line WLb.

In the memory cell in FIG. 9A, in data writing, the transistor 202 is turned on, so that a potential of a signal including data is given from the data line DL to the gate electrode of the transistor 201 through the transistor 202. The gate capacitance of the transistor 201 and the amount of charge accumulated in the capacitor 203 are controlled in accordance with the potential of the signal, so that data is written into the transistor 201 and the capacitor 203.

When data is held, the transistor 202 is turned off, so that the charge accumulated in the gate capacitance of the transistor 201 and the capacitor 203 is held. With use of an oxide semiconductor for the semiconductor film in the transistor 202, the off-state current of the transistor 202 can be extremely small. Therefore, the accumulated charge is unlikely to leak, and thus, the data can be held for a long period of time as compared to the case where a semiconductor material such as silicon is used for the transistor 202.

In data reading, a potential of the second word line WLb is changed. A potential difference between the pair of electrodes included in the capacitor 203 is kept in accordance with the principle of charge conservation, and thus, the change in the potential of the second word line WLb is given to the gate electrode of the transistor 201. The threshold voltage of the transistor 201 is changed depending on the amount of charge accumulated in the gate capacitance of the transistor 201. Therefore, a difference in the amount of accumulated charge is read from the amount of drain current of the transistor 201 which is obtained through the change in the potential of the gate electrode of the transistor 201, whereby data can be read.

Note that an oxide semiconductor may be used for a semiconductor film of the transistor 201. Alternatively, a semiconductor such as silicon or germanium may be used for the semiconductor film of the transistor 201. Note that use of an oxide semiconductor films for each semiconductor film of all of the transistors in the memory cell leads to simplification of a manufacturing process. Further, for example, the semiconductor film of the transistor 201 can be formed using a semiconductor such as polycrystalline silicon or single crystal silicon which provides higher mobility than an oxide semiconductor, whereby data can be read from the memory cell at high speed.

In this embodiment, taking an example of the case where silicon is used for the semiconductor film of the transistor 201 in the lower layer and an oxide semiconductor is used for the semiconductor film of the transistor 202 in the upper layer, the method of manufacturing the semiconductor device is described. Note that as described above, as well as silicon, a semiconductor material such as germanium, silicon germanium, or single crystal silicon carbide may be used for the transistor 201 in the lower layer. For example, the transistor formed using silicon can be formed using a single crystal semiconductor substrate such as a silicon wafer, a silicon thin film which is formed by an SOI method, a silicon thin film which is formed by a vapor deposition method, or the like. Alternatively, as in the transistor in the upper layer, the transistor 201 in the lower layer may also be formed using an oxide semiconductor.

Figure 6A:
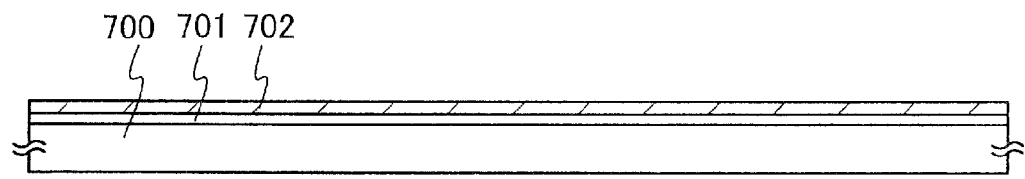
FIGS. 6A to 6D are views illustrating a method of manufacturing a semiconductor device.

In this embodiment, first, as illustrated in FIG. 6A, an insulating film 701 and a semiconductor film 702 that is separated from a single crystal semiconductor substrate are formed over a substrate 700.

Although there is no particular limitation on a material which can be used as the substrate 700, it is necessary that the material have at least heat resistance high enough to withstand heat treatment to be performed later. For example, a glass substrate formed by a fusion process or a float process, a quartz substrate, a semiconductor substrate, a ceramic substrate, or the like can be used as the substrate 700. As the glass substrate, the one whose strain point is 730° C. or higher is preferably used in the case where the temperature of the heat treatment to be performed later is high.

In this embodiment, a method of manufacturing the transistor 201 is described by taking an example in which the semiconductor film 702 is formed using single crystal silicon. Note that a specific example of a method of forming the single crystal semiconductor film 702 is briefly described. First, an ion beam including ions which are accelerated by an electric field enters a bond substrate which is the single crystal semiconductor substrate and a fragile layer which is fragile because of local disorder of the crystal structure is formed in a region at a certain depth from a surface of the bond substrate. The depth at which the fragile layer is formed can be adjusted by the acceleration energy of the ion beam and the angle at which the ion beam enters. Then, the bond substrate and the substrate 700 which is provided with the insulating film 701 are attached to each other so that the insulating film 701 is interposed therebetween. After the bond substrate and the substrate 700 overlap with each other, a pressure of approximately 1 to 500 N/cm$^2$, preferably 11 to 20 N/cm$^2$ is applied to part of the bond substrate and part of the substrate 700 so that the substrates are attached to each other. When the pressure is applied, bonding between the bond substrate and the insulating film 701 starts from the parts, which results in bonding of the entire surface where the bond substrate and the insulating film 701 are in close contact with each other. Then, heat treatment is performed, whereby microvoids that exist in the embrittlement layer increase in volume and are thus combined with each other. Accordingly, a single crystal semiconductor film which is part of the bond substrate is separated from the bond substrate along the fragile layer. The heat treatment is performed at a temperature not exceeding the strain point of the substrate 700. Then, the single crystal semiconductor film is processed into a desired shape by etching or the like, so that the semiconductor film 702 can be formed.

In order to control the threshold voltage, an impurity element imparting p-type conductivity, such as boron, aluminum, or gallium, or an impurity element imparting n-type conductivity, such as phosphorus or arsenic, may be added to the semiconductor film 702. An impurity element for controlling the threshold voltage may be added to the semiconductor film which is not patterned or may be added to the patterned semiconductor film 702. Alternatively, the impurity element for controlling the threshold voltage may be added to the bond substrate. Further alternatively, the impurity element may be added to the bond substrate in order to roughly control the threshold voltage, and the impurity element may be further added to the semiconductor film which is not patterned or the patterned semiconductor film 702 in order to finely control the threshold voltage.

Note that although an example in which a single crystal semiconductor film is used is described in this embodiment, the invention is not limited to this structure. For example, a polycrystalline, microcrystalline, or amorphous semiconductor film which is formed over the insulating film 701 by vapor deposition may be used. Alternatively, the semiconductor film may be crystallized by a known technique. As the known technique of crystallization, a laser crystallization method using a laser beam and a crystallization method using a catalytic element are given. Alternatively, a crystallization method using a catalytic element and a laser crystallization method may be combined. When a heat-resistant substrate such as a quartz substrate is used, any of a thermal crystallization method using an electrically heated furnace, a lamp annealing crystallization method using infrared light, a crystallization method using a catalytic element, and a high-temperature annealing method at approximately 950° C. may be used.

Figure 6B:
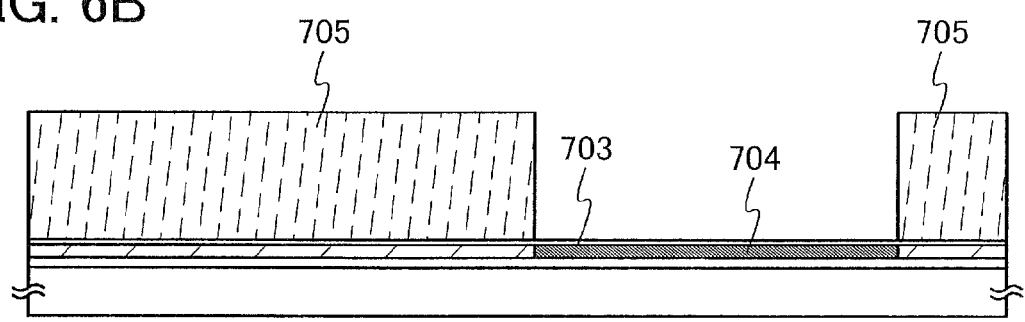

Next, as illustrated in FIG. 6B, a gate insulating film 703 is formed over the semiconductor film 702. Then, a mask 705 is formed over the gate insulating film 703 and an impurity element imparting conductivity is added to part of the semiconductor film 702, so that an impurity region 704 is formed.

The gate insulating film 703 can be formed by oxidation or nitriding of a surface of the semiconductor film 702 by high-density plasma treatment, heat treatment, or the like. The high-density plasma treatment is performed, for example, by using a mixed gas of a rare gas such as He, Ar, Kr, or Xe, and oxygen, nitrogen oxide, ammonia, nitrogen, hydrogen, or the like. In this case, by exciting plasma by introduction of microwaves, plasma with a low electron temperature and high density can be generated. By oxidation or nitriding of the surface of the semiconductor film with oxygen radicals (including OH radicals in some cases) or nitrogen radicals (including NH radicals in some cases) generated by such high-density plasma, an insulating film with a thickness of 1 to 20 nm, preferably 5 to 10 nm can be formed so as to be in contact with the semiconductor film. For example, a surface of the semiconductor film 702 is oxidized or nitrided using nitrous oxide ($N_2O$) diluted with Ar by 1 to 3 times (flow rate ratio) by application of a microwave (2.45 GHz) power of 3 to 5 kW at a pressure of 10 to 30 Pa. By this treatment, an insulating film having a thickness of 1 to 10 nm (preferably 2 to 6 nm) is formed. Further, nitrous oxide ($N_2O$) and silane ($SiH_4$) are introduced and a microwave (2.45 GHz) power of 3 to 5 kW is applied at a pressure of 10 to 30 Pa so that a silicon oxynitride film is formed by a vapor deposition method, thereby forming the gate insulating film. With a combination of a solid-phase reaction and a reaction by a vapor deposition method, the gate insulating film with low interface state density and excellent withstand voltage can be formed.

The oxidation or nitriding of the semiconductor film by the high-density plasma treatment proceeds by solid-phase reaction. Thus, interface state density between the gate insulating film 703 and the semiconductor film 702 can be extremely low. Further, by direct oxidation or nitriding of the semiconductor film 702 by high-density plasma treatment, variations in the thickness of the insulating film to be formed can be suppressed. Moreover, in the case where the semiconductor film has crystallinity, the surface of the semiconductor film is oxidized with solid reaction by the high-density plasma treatment to restrain fast oxidation only in a crystal grain boundary; therefore, the gate insulating film with uniformity and low interface state density can be formed. Variations in the characteristics of a transistor whose gate insulating film partly or entirely includes an insulating film formed by high-density plasma treatment can be suppressed.

The gate insulating film 703 may be formed using a single layer or a stack of layers of a film containing silicon oxide, silicon nitride oxide, silicon oxynitride, silicon nitride, hafnium oxide, aluminum oxide, tantalum oxide, yttrium oxide, hafnium silicate ($HfSi_xO_y$, (x>0, y>0)), hafnium silicate ($HfSi_xO_y$, (x>0, y>0)) to which nitrogen is added, hafnium aluminate ($HfAl_xO_y$, (x>0, y>0)) to which nitrogen is added, or the like by a plasma-enhanced CVD method, a sputtering method, or the like.

Note that in this specification, an oxynitride compound refers to a material containing a higher quantity of oxygen than that of nitrogen, and a nitride oxide compound refers to a material containing a higher quantity of nitrogen than that of oxygen.

The thickness of the gate insulating film 703 can be, for example, 1 to 100 nm, preferably 10 to 50 nm In this embodiment, a single-layer insulating film containing silicon oxide is formed as the gate insulating film 703 by a plasma-enhanced CVD method.

Figure 6C:
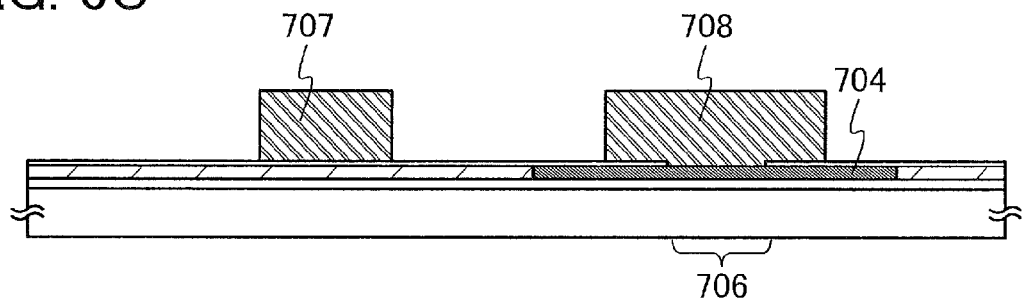

Then, after the mask 705 is removed, part of the gate insulating film 703 is removed as illustrated in FIG. 6C and an opening 706 is formed in a region overlapping with the impurity region 704 by etching or the like. After that, a conductive film 707 and a conductive film 708 are formed. The conductive film 707 functions as the gate electrode of the transistor 201 and one of the source electrode and the drain electrode of the transistor 202. The conductive film 708 functions as the source electrode or the drain electrode of the transistor 201 and the other of the source electrode and the drain electrode of the transistor 202.

A conductive film is formed so as to cover the opening 706 and then is processed (patterned) into a predetermined shape, so that the conductive film 707 and the conductive film 708 can be formed. The conductive film 708 is in contact with the impurity region 704 in the opening 706. The conductive film can be formed by a CVD method, a sputtering method, a vapor deposition method, a spin coating method, or the like. For the conductive film, tantalum (Ta), tungsten (W), titanium (Ti), molybdenum (Mo), aluminum (Al), copper (Cu), chromium (Cr), niobium (Nb), or the like can be used. Moreover, an alloy containing the above metal as the main component or a compound containing the above metal may be used. Alternatively, the conductive film may be formed using a semiconductor such as polycrystalline silicon doped with an impurity element such as phosphorus which imparts conductivity to the semiconductor film.

Note that although the conductive film 707 and the conductive film 708 are formed using a single-layer conductive film in this embodiment, this embodiment is not limited to this structure. The conductive film 707 and the conductive film 708 may be formed of a plurality of stacked conductive films.

As a combination of two conductive films, tantalum nitride or tantalum can be used for one conductive film and tungsten can be used for the other conductive film. Besides, the following combinations are given: tungsten nitride and tungsten, molybdenum nitride and molybdenum, aluminum and tantalum, aluminum and titanium, and the like. Since tungsten and tantalum nitride have high heat resistance, heat treatment for thermal activation can be performed after the two conductive films are formed. Alternatively, as the combination of the two conductive films, for example, nickel silicide and silicon doped with an impurity element which imparts n-type conductivity, tungsten silicide and silicon doped with an impurity element which imparts n-type conductivity, or the like can be used.

In the case of using a three-layer structure which is stacked with three conductive films, a stacked structure of a molybdenum film, an aluminum film, and a molybdenum film is preferable.

An oxide conductive film of indium oxide, a mixture of indium oxide and tin oxide, a mixture of indium oxide and zinc oxide, zinc oxide, zinc aluminum oxide, zinc aluminum oxynitride, zinc gallium oxide, or the like may alternatively be used for the conductive film 707 and the conductive film 708.

Note that the conductive film 707 and the conductive film 708 may be selectively formed by a droplet discharge method without the use of a mask. A droplet discharge method is a method for forming a predetermined pattern by discharge or ejection of a droplet containing a predetermined composition from an orifice, and includes an inkjet method in its category.

In addition, the conductive film 707 and the conductive film 708 may be formed by forming a conductive film and etching the conductive film into a desired tapered shape by an inductively coupled plasma (ICP) etching method under appropriately controlled conditions (e.g., the amount of power applied to a coiled electrode layer, the amount of power applied to an electrode layer on the substrate side, and the electrode temperature on the substrate side). In addition, angles and the like of the tapered shapes can also be controlled by a shape of a mask. Note that as an etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

Figure 6D:
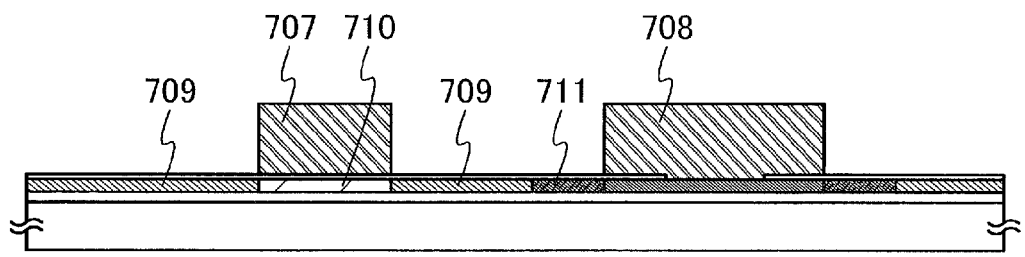

Next, as illustrated in FIG. 6D, when an impurity element which imparts one conductivity is added to the semiconductor film 702 with the conductive film 707 and the conductive film 708 used as masks, a channel formation region 710 overlapping with the conductive film 707, a pair of impurity regions 709 between which the channel formation region 710 is interposed, and an impurity region 711 obtained by further addition of an impurity element to part of the impurity region 704 are formed in the semiconductor film 702.

In this embodiment, the case where an impurity element which imparts p-type conductivity (e.g., boron) is added to the semiconductor film 702 is described.

Figure 7A:
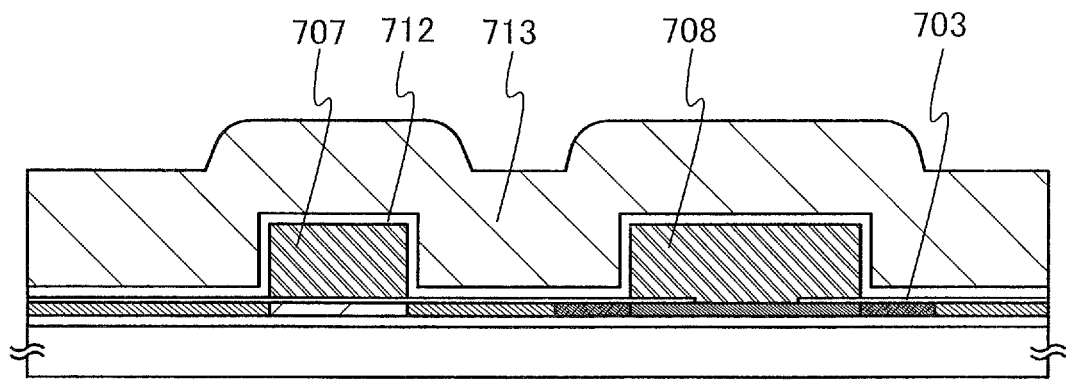
FIGS. 7A to 7C are views illustrating a method of manufacturing a semiconductor device.

Next, as illustrated in FIG. 7A, insulating films 712 and 713 are formed so as to cover the gate insulating film 703 and the conductive films 707 and 708. Specifically, an inorganic insulating film containing silicon oxide, silicon nitride, silicon nitride oxide, silicon oxynitride, aluminum nitride, aluminum nitride oxide, or the like can be used for the insulating films 712 and 713. In particular, the insulating films 712 and 713 are preferably formed using a low dielectric constant (low-k) material because capacitance due to overlapping of electrodes or wirings can be sufficiently reduced. Note that a porous insulating film containing such a material may be employed as the insulating films 712 and 713. Since the porous insulating film has lower dielectric constant than a dense insulating film, parasitic capacitance due to electrodes or wirings can be further reduced.

In this embodiment, an example in which silicon oxynitride is used for the insulating film 712 and silicon nitride oxide is used for the insulating film 713 is described. In addition, this embodiment shows an example in which the insulating films 712 and 713 are formed over the conductive films 707 and 708; however, according to one embodiment of the invention, only one insulating film or a stack of a plurality of insulating films of three or more layers may be formed over the conductive films 707 and 708.

Figure 7B:
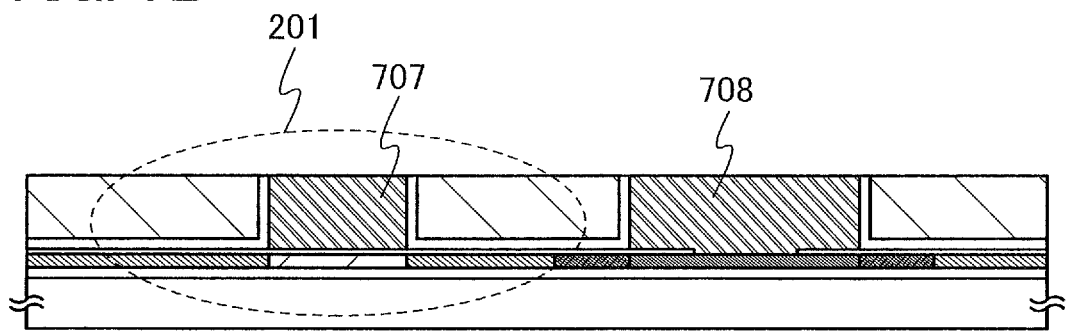

Next, as illustrated in FIG. 7B, the insulating films 712 and 713 are subjected to CMP or etching for example, so that surfaces of the conductive films 707 and 708 are exposed. Note that in order to improve the characteristics of the transistor 202 which is formed later, surfaces of the insulating films 712 and 713 are preferably flattened as much as possible.

Through the above process, the thin film transistor 201 can be formed.

Figure 7C:
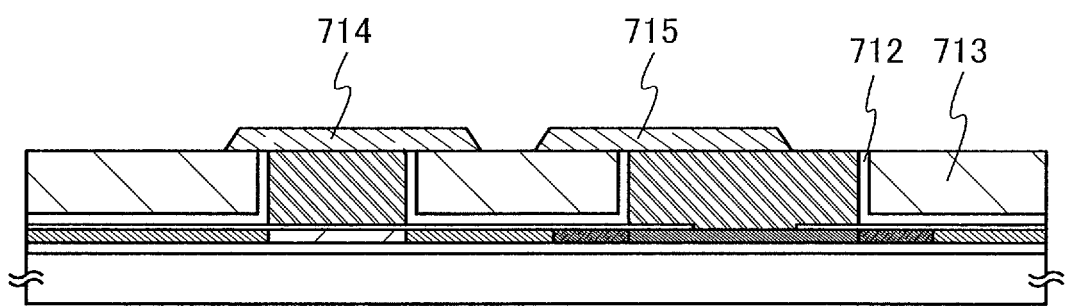

The following shows a method of manufacturing the transistor 202. First, as illustrated in FIG. 7C, a conductive film 714 and a conductive film 715 are formed over the conductive film 707 and the conductive film 708, respectively. The conductive film 714 functions as one of the source electrode and the drain electrode of the transistor 202 and the conductive film 715 functions as the other of the source electrode and the drain electrode of the transistor 202.

Specifically, the conductive films 714 and 715 can be formed in such a manner that a conductive film is formed so as to cover the conductive films 707 and 708 and the insulating films 712 and 713 by a sputtering method or a vapor deposition method and then is processed (patterned) into a predetermined shape. Further, the conductive films 714 and 715 each preferably have a tapered shape at an end portion thereof and a small thickness in order to ensure excellent step coverage with an oxide semiconductor film 716 that is to be formed later over the conductive films 714 and 715. Specifically, the tapered angle at each end portion of the conductive films 714 and 715 is preferably greater than or equal to 20° and less than or equal to 80°, more preferably greater than or equal to 30° and less than or equal to 60°. In addition, specifically, the thickness of each of the conductive films 714 and 715 is preferably greater than or equal to 10 nm and less than or equal to 300 nm, more preferably greater than or equal to 100 nm and less than or equal to 200 nm.

For the conductive film for forming the conductive films 714 and 715, any of the following materials can be used: an element selected from aluminum, chromium, copper, tantalum, titanium, molybdenum, or tungsten; an alloy containing any of these elements; an alloy film containing the above elements in combination; and the like. Alternatively, a stacked structure may be employed in which a film of a refractory metal such as chromium, tantalum, titanium, molybdenum, or tungsten is over or below a metal film of aluminum or copper. Aluminum or copper is preferably used in combination with a refractory metal material in order to avoid problems with heat resistance and corrosion. As the refractory metal material, molybdenum, titanium, chromium, tantalum, tungsten, neodymium, scandium, yttrium, or the like can be used.

Further, the conductive film which serves as the conductive films 714 and 715 may have a single-layer structure or a stacked structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in that order, and the like can be given. A Cu—Mg—Al alloy, a Cu—Mg mixed oxide, a Cu—Ca mixed oxide, a Cu—Mg—Al mixed oxide, a Mo—Ti alloy, Ti, and Mo have high adhesiveness with an oxide film. Therefore, for the conductive films 714 and 715, a stacked structure is employed in which a conductive film containing a Cu—Mg—Al alloy, a Cu—Mg mixed oxide, a Cu—Ca mixed oxide, a Cu—Mg—Al mixed oxide, a Mo—Ti alloy, Ti, or Mo is used for the lower layer and a conductive film containing Cu, which has a low resistance value, is used for the upper layer; thus, in the case where the insulating films 712 and 713 are oxide films, the adhesiveness between an insulating film 712 or 713 and the conductive films 714 and 715 can be increased, and the resistance value of the conductive films 714 and 715 can be suppressed to be low.

For the conductive film which serves as the conductive films 714 and 715, a conductive metal oxide may be used. As the conductive metal oxide, indium oxide, tin oxide, zinc oxide, a mixture of indium oxide and tin oxide, a mixture of indium oxide and zinc oxide, or the conductive metal oxide material containing silicon or silicon oxide can be used.

Figure 8A:
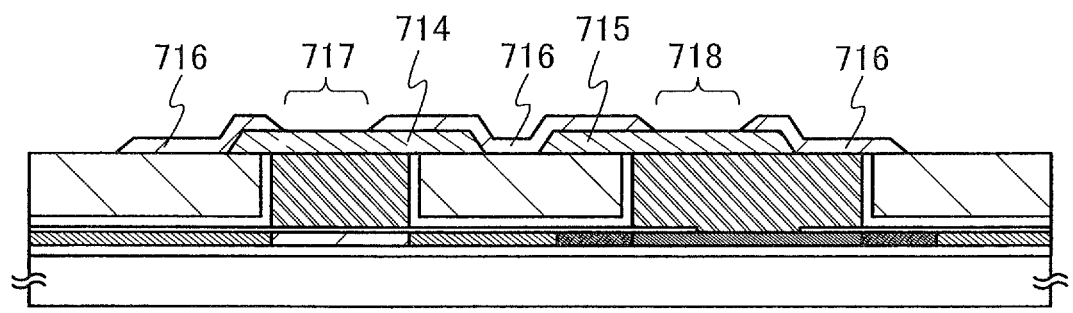
FIGS. 8A to 8C are views illustrating a method of manufacturing a semiconductor device.

Next, as illustrated in FIG. 8A, the oxide semiconductor film 716 is formed over the conductive films 714 and 715. The oxide semiconductor film 716 has an opening 717 over the conductive film 714 and an opening 718 over the conductive film 715. The oxide semiconductor film 716 can be formed by processing an oxide semiconductor film formed over the insulating films 712 and 713 and the conductive films 714 and 715 into the above-described shape.

The thickness of the oxide semiconductor film is 2 to 200 nm, preferably 3 to 50 nm, more preferably 3 to 20 nm. The oxide semiconductor film is formed by a sputtering method using an oxide semiconductor target. Moreover, the oxide semiconductor film can be formed by a sputtering method under a rare gas (e.g., argon) atmosphere, an oxygen atmosphere, or a mixed atmosphere of a rare gas (e.g., argon) and oxygen.

As described above, for the oxide semiconductor film, indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used. The above oxide semiconductor may contain silicon.

In this embodiment, as the oxide semiconductor film, an In—Ga—Zn-based oxide semiconductor thin film with a thickness of 30 nm, which is obtained by a sputtering method using a target containing indium (In), gallium (Ga), and zinc (Zn), is used. As the In—Ga—Zn—O-based oxide target, for example, an oxide target having a composition of $In_2O_3$:$Ga_2O_3$:$ZnO$=1:1:1 [molar ratio] can be used. Alternatively, an oxide target having a composition of $In_2O_3$:$Ga_2O_3$:$ZnO$=1:1:2 [molar ratio] may be used. The filling factor of the target containing In, Ga, and Zn is 90% or higher and 100% or lower, and preferably 95% or higher and lower than 100%. With use of the target with a high filling factor, a dense oxide semiconductor film is formed.

In the case where an In—Zn-based oxide is used as an oxide semiconductor, the atomic ratio of metal elements in a target to be used is In:Zn=50:1 to 1:2 ($In_2O_3$:$ZnO$=25:1 to 1:4 in molar ratio), preferably In:Zn=20:1 to 1:1 ($In_2O_3$:$ZnO$=10:1 to 1:2 in molar ratio), more preferably In:Zn=15:1 to 1.5:1 ($In_2O_3$:$ZnO$=15:2 to 3:4 in molar ratio). In a target used for formation of an In—Zn-based oxide semiconductor having an atomic ratio of In:Zn:O=X: Y:Z, for example, the relation of $Z>1.5X+Y$ is satisfied.

For formation of an In—Sn—Zn-based oxide layer, the atomic ratio of metal elements in a target to be used is In:Sn:Zn=1:2:2, 2:1:3, 1:1:1, 20:45:35, or the like.

In this embodiment, the oxide semiconductor film is formed in such a manner that the substrate is held in a treatment chamber kept in a reduced pressure state, moisture remaining in the treatment chamber is removed, a sputtering gas from which hydrogen and moisture are removed is introduced, and the target is used. The substrate temperature may be 100° C. to 600° C., preferably 200° C. to 400° C. in film formation. By forming the oxide semiconductor film in a state where the substrate is heated, the concentration of impurities contained in the formed oxide semiconductor film can be reduced. In addition, damage by sputtering can be reduced. In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with the cryopump, for example, a hydrogen atom, a compound containing a hydrogen atom, such as water ($H_2O$), (more preferably, also a compound containing a carbon atom), and the like are removed, whereby the impurity concentration in the oxide semiconductor film formed in the treatment chamber can be reduced.

As one example of the deposition condition, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that a pulsed direct-current (DC) power supply is preferable because dust generated in deposition can be reduced and the film thickness can be made uniform.

Note that etching for forming the oxide semiconductor film 716 may be dry etching, wet etching, or both dry etching and wet etching. As an etching gas used for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, a parallel plate RIE (reactive ion etching) method or an ICP (inductively coupled plasma) etching method can be used. In order to etch the film to have a desired shape, the etching conditions (e.g., the amount of power applied to a coiled electrode, the amount of power applied to an electrode on the substrate side, and the electrode temperature on the substrate side) are adjusted as appropriate.

As an etchant used for the wet etching, a mixed solution of phosphoric acid, acetic acid, and nitric acid, or organic acid such as citric acid or oxalic acid can be used. In this embodiment, ITO-07N (produced by KANTO CHEMICAL CO., INC.) is used.

A resist mask used for forming the oxide semiconductor film 716 may be formed by an inkjet method. Formation of the resist mask by an inkjet method needs no photomask; thus, manufacturing cost can be reduced.

Note that the oxide semiconductor film formed by sputtering or the like contains a large amount of moisture or hydrogen (including a hydroxyl group) as an impurity in some cases. Moisture or hydrogen easily forms donor levels and thus serves as an impurity in the oxide semiconductor. In one embodiment of the invention, in order to reduce impurities such as moisture or hydrogen in the oxide semiconductor film (to perform dehydration or dehydrogenation), the oxide semiconductor film 716 is preferably subjected to heat treatment in a reduced pressure atmosphere, an inert gas atmosphere containing nitrogen, a rare gas, or the like, an oxygen gas atmosphere, or an ultra dry air atmosphere (the moisture content is 20 ppm (−55° C. by conversion into a dew point) or lower, preferably 1 ppm or lower, further preferably 10 ppb or lower, in the case where the measurement is performed by a dew point meter in a cavity ring down laser spectroscopy (CRDS) method).

The heat treatment on the oxide semiconductor film 716 can eliminate moisture or hydrogen from the oxide semiconductor film 716. Specifically, the heat treatment may be performed at a temperature higher than or equal to 250° C. and lower than or equal to 750° C., preferably higher than or equal to 400° C. and lower than the strain point of the substrate. For example, the heat treatment may be performed at 500° C. for approximately three minutes to six minutes. When RTA is used for the heat treatment, dehydration or dehydrogenation can be performed in a short time; thus, treatment can be performed even at a temperature higher than the strain point of the glass substrate.

In this embodiment, an electric furnace that is one of heat treatment apparatuses is used. Note that the heat treatment apparatus is not limited to an electric furnace, and may have a device for heating an object by heat conduction or heat radiation from a heater such as a resistance heater. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, like nitrogen or a rare gas such as argon, is used.

In the heat treatment, it is preferable that moisture, hydrogen, or the like be not contained in nitrogen or a rare gas such as helium, neon, or argon. Alternatively, the purity of nitrogen or a rare gas such as helium, neon, or argon which is introduced into the heat treatment apparatus is preferably 6N (99.9999%) or higher, more preferably 7N (99.99999%) or higher (i.e., the impurity concentration is preferably 1 ppm or lower, more preferably 0.1 ppm or lower).

Note that it has been pointed out that an oxide semiconductor is insensitive to impurities, that there is no problem when a considerable amount of metal impurities is contained in the film, and that inexpensive soda-lime glass which contains a large amount of alkali metal such as sodium can also be used (Kamiya, Nomura, and Hosono, "Engineering application of solid state physics: Carrier transport properties and electronic structures of amorphous oxide semiconductors: the present status", *KOTAI BUTSURI (SOLID STATE PHYSICS)*, 2009, Vol. 44, pp. 621-633). However, such consideration is not appropriate. Alkali metal is not a constituent of an oxide semiconductor, and therefore is an impurity. Alkaline earth metal is also an impurity when it is not contained as a constituent of an oxide semiconductor. Alkali metal, in particular, Na becomes $Na^+$ when an insulating film in contact with the oxide semiconductor film is an oxide and Na diffuses into the insulating film. In addition, in the oxide semiconductor film, Na cuts or enters a bond between metal and oxygen which are constituents of an oxide semiconductor. As a result, characteristics of the transistor are degraded; for example, the transistor becomes normally on owing to shift of a threshold voltage in the negative direction, or the mobility decreases. In addition, characteristics also vary. Such degradation and variations in characteristics of the transistor due to the impurity remarkably appear when the hydrogen concentration in the oxide semiconductor film is very low. Accordingly, when the hydrogen concentration in the oxide semiconductor film is $1\times10^{18}/cm^3$ or lower, in particular, $1\times10^{17}/cm^3$ or lower, the concentration of the above impurity is preferably reduced. Specifically, a measurement value of a Na concentration by secondary ion mass spectrometry is preferably $5\times10^{16}/cm^3$ or lower, more preferably $1\times10^{16}/cm^3$ or lower, still more preferably $1\times10^{15}/cm^3$ or lower. In a similar manner, a measurement value of a Li concentration is preferably $5\times10^{15}/cm^3$ or lower, more preferably $1\times10^{15}/cm^3$ or lower. In a similar manner, a measurement value of a K concentration is preferably $5\times10^{15}/cm^3$ or lower, more preferably $1\times10^{15}/cm^3$ or lower.

Through the above process, the concentration of hydrogen in the oxide semiconductor film 716 can be reduced and the oxide semiconductor film can be highly purified. Thus, the oxide semiconductor film can be stabilized. In addition, heat treatment at a temperature of lower than or equal to the glass transition temperature makes it possible to form an oxide semiconductor film with a wide band gap in which carrier density is extremely low. Therefore, the transistor can be manufactured using a large substrate, so that the productivity can be increased. In addition, with use of the oxide semiconductor film in which the hydrogen concentration is reduced and the purity is improved, it is possible to manufacture a transistor with high withstand voltage and an extremely small off-state current.

Note that the oxide semiconductor film may be amorphous or crystalline. As a crystalline oxide semiconductor film, an oxide semiconductor including crystals with c-axis alignment (also referred to as CAAC: c axis aligned crystal) is also preferable because the effect of improving the reliability of a transistor can be obtained.

Sputtering may be performed to form an oxide semiconductor film including CAAC. In order to obtain CAAC by sputtering, it is important to form hexagonal crystals in an initial stage of deposition of an oxide semiconductor film and to cause crystal growth from the hexagonal crystals as cores. In order to achieve this, it is preferable that the distance between the target and the substrate be made to be long (e.g., about 150 to 200 mm) and a substrate heating temperature be 100 to 500° C., more preferably 200 to 400° C., still preferably 250 to 300° C. In addition to this, the deposited oxide semiconductor film is subjected to heat treatment at a temperature higher than the substrate heating temperature in the deposition. Therefore, micro-defects in the film and defects at the interface of a stacked layer can be compensated.

Bonds between metal and oxygen are more ordered in the CAAC-OS (c axis aligned crystalline oxide semiconductor) than in an amorphous oxide semiconductor. That is, in the case where an oxide semiconductor is amorphous, the coordination numbers might vary between various metal atoms, but the coordination numbers of metal atoms are almost the same as each other in the CAAC-OS film. Therefore, microscopic vacancies of oxygen can be reduced and instability and moving of charge that are due to ejection or bonding of hydrogen atoms (including hydrogen ions) or alkali metal atoms can be reduced.

Accordingly, by forming a transistor using an oxide semiconductor film that includes the CAAC-OS, the amount of shift of the threshold voltage of the transistor, which occurs after light irradiation or a bias-temperature (BT) stress test are performed on the transistor, can be reduced. Accordingly, a transistor having stable electrical characteristics can be formed.

Figure 8B:
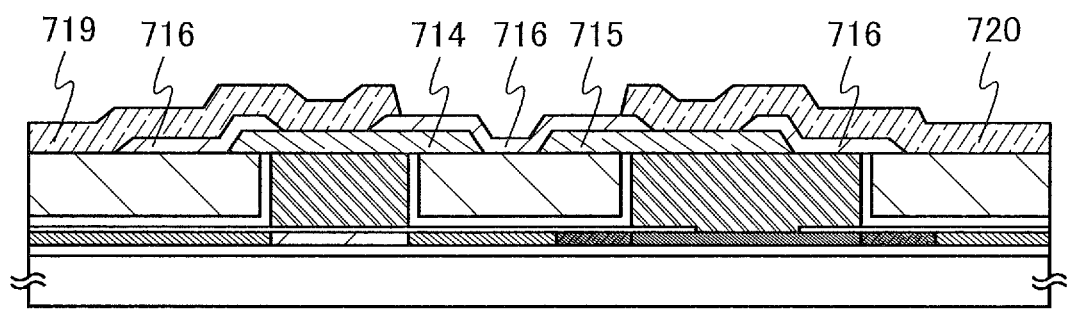

Next, as illustrated in FIG. 8B, a conductive film 719 is formed in contact with the conductive film 714 and the oxide semiconductor film 716, and a conductive film 720 is formed in contact with the conductive film 715 and the oxide semiconductor film 716. The conductive films 719 and 720 can be formed using materials, stack structures, and manners similar to those of the conductive films 714 and 715.

Note that at the time of etching for forming the conductive films 719 and 720, each material and etching conditions are adjusted as appropriate so that the oxide semiconductor film 716 is not removed as much as possible. Depending on the etching conditions, an exposed portion of the oxide semiconductor film 716 is partly etched and a groove (a depression portion) is formed in some cases.

In this embodiment, a titanium film is used for the conductive films 719 and 720. Thus, the conductive films 719 and 720 can be formed by selective wet etching using a solution (an ammonia hydrogen peroxide mixture) containing ammonia and hydrogen peroxide water. As the ammonia hydrogen peroxide mixture, specifically, a solution in which hydrogen peroxide water of 31 wt %, ammonia water of 28 wt %, and water are mixed at a volume ratio of 5:2:2 is used. Alternatively, the conductive films 719 and 720 may be formed by dry etching using a gas containing chlorine ($Cl_2$), boron chloride ($BCl_3$), or the like.

Further, a conductive metal oxide film such as a zinc oxide film, a zinc aluminum oxide film, a zinc aluminum oxynitride film, or a zinc gallium oxide film may be formed between the oxide semiconductor film 716 and the conductive film 719 functioning as one of the source electrode and the drain electrode and between the oxide semiconductor film 716 and the conductive film 720 functioning as the other of the source electrode and the drain electrode. For example, in the case where the metal oxide film is formed, patterning for forming the metal oxide film and patterning for forming the conductive films 719 and 720 may be performed concurrently. The metal oxide film can reduce the resistance between the oxide semiconductor film 716 and the conductive films 719 and 720, so that the transistor can operate at high speed. The metal oxide film can also increase the withstand voltage of the transistor.

Next, plasma treatment may be performed using a gas such as $N_2O$, $N_2$, or Ar. By this plasma treatment, water or the like adhering to an exposed surface of the oxide semiconductor film is removed. Plasma treatment may be performed using a mixed gas of oxygen and argon as well.

Figure 8C:
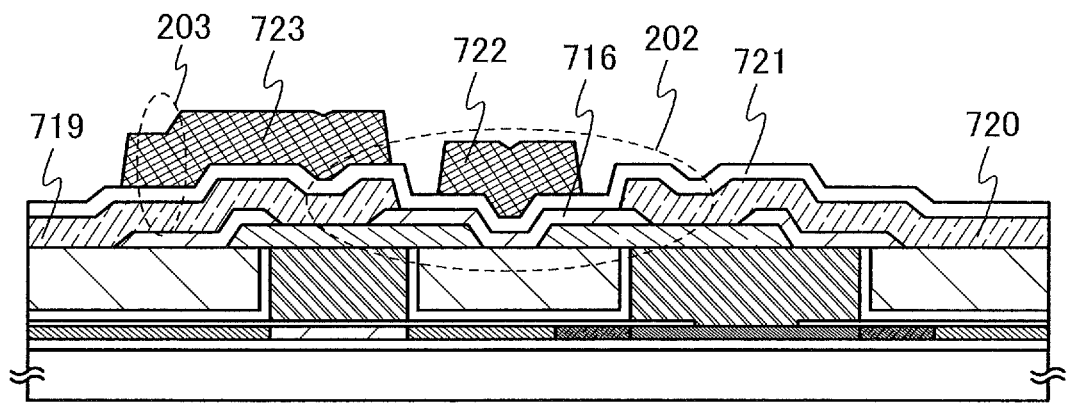

After the plasma treatment, as illustrated in FIG. 8C, the gate insulating film 721 is formed so as to cover the conductive films 719 and 720 and the oxide semiconductor film 716. Then, a conductive film 722 is formed over the gate insulating film 721 in a position overlapping with the oxide semiconductor film 716, and a conductive film 723 is formed over the conductive film 719 in a position overlapping with the conductive film 719. The conductive film 722 functions as the gate electrode of the transistor 202.

The gate insulating film 721 can be formed using a material and a layered structure which are similar to those of the gate insulating film 703. Note that it is preferable that the gate insulating film 721 do not contain impurities such as moisture or hydrogen as much as possible, and the gate insulating film 721 may be formed using a single-layer insulating film or a stack of a plurality of insulating films. When hydrogen is contained in the gate insulating film 721, hydrogen enters the oxide semiconductor film 716 or oxygen in the oxide semiconductor film 716 is extracted by hydrogen, whereby the oxide semiconductor film 716 has lower resistance (n-type conductivity); thus, a parasitic channel might be formed. Thus, it is important that a deposition method in which hydrogen is not used be employed in order to form the gate insulating film 721 that does not contain hydrogen as much as possible. A material having a high barrier property is preferably used for the gate insulating film 721. As the insulating film having a high barrier property, a silicon nitride film, a silicon nitride oxide film, an aluminum nitride film, an aluminum nitride oxide film, or the like can be used, for example. When a stack of a plurality of insulating films is used, an insulating film having low proportion of nitrogen such as a silicon oxide film or a silicon oxynitride film is formed on a side which is closer to the oxide semiconductor film 716 than the insulating film having a high barrier property. Then, the insulating film having a high barrier property is formed so as to overlap with the conductive films 719 and 720 and the oxide semiconductor film 716 with the insulating film having low proportion of nitrogen interposed therebetween. When the insulating film having a high barrier property is used, impurities such as moisture or hydrogen can be prevented from entering the oxide semiconductor film 716, the gate insulating film 721, or the interface between the oxide semiconductor film 716 and another insulating film and the vicinity thereof. In addition, the insulating film having low proportion of nitrogen, such as a silicon oxide film or a silicon oxynitride film, is formed so as to be in contact with the oxide semiconductor film 716, so that the insulating film having a high barrier property can be prevented from being in direct contact with the oxide semiconductor film 716.

In this embodiment, the gate insulating film 721 with a structure in which a 100-nm-thick silicon nitride film formed by sputtering is stacked over a 200-nm-thick silicon oxide film formed by sputtering is formed. The substrate temperature in film formation may be higher than or equal to room temperature and lower than or equal to 300° C. and in this embodiment, is 100° C.

After the gate insulating film 721 is formed, heat treatment may be performed. The heat treatment is performed in a nitrogen atmosphere, ultra-dry air, or a rare gas (e.g., argon or helium) atmosphere preferably at 200 to 400° C., for example, 250 to 350° C. It is preferable that the water content in the gas be 20 ppm or lower, preferably 1 ppm or lower, further preferably 10 ppb or lower. In this embodiment, heat treatment is performed at 250° C. for 1 hour under a nitrogen atmosphere. Alternatively, RTA treatment for a short time at a high temperature may be performed before the formation of the conductive films 719 and 720 in a manner similar to that of the heat treatment performed on the oxide semiconductor film for reduction of moisture or hydrogen. Even when oxygen vacancies are generated in the oxide semiconductor film 716 by the heat treatment performed on the oxide semiconductor film 716 by performing heat treatment after provision of the gate insulating film 721 containing oxygen, oxygen is supplied to the oxide semiconductor film 716 from the gate insulating film 721. By the supply of oxygen to the oxide semiconductor film 716, oxygen vacancies that serve as donors can be reduced in the oxide semiconductor film 716 and the stoichiometry can be satisfied. It is preferable that the proportion of oxygen in the oxide semiconductor film 716 is higher than that of the stoichiometry. As a result, the oxide semiconductor film 716 can be made to be substantially i-type and variations in electrical characteristics of the transistor due to oxygen vacancies can be reduced; thus, electrical characteristics can be improved. There is no particular limitation on the timing of this heat treatment as long as it is after the formation of the gate insulating film 721. When this heat treatment also serves as heat treatment in another step (e.g., heat treatment at the time of formation of a resin film or heat treatment for lowering the resistance of a transparent conductive film), the oxide semiconductor film 716 can be made to be substantially i-type without an increase in the number of steps.

Alternatively, the oxygen vacancies that serve as donors in the oxide semiconductor film 716 may be reduced by subjecting the oxide semiconductor film 716 to heat treatment under an oxygen atmosphere so that oxygen is added to the oxide semiconductor. The heat treatment is performed at a temperature of, for example, higher than or equal to 100° C. and lower than 350° C., preferably higher than or equal to 150° C. and lower than 250° C. It is preferable that an oxygen gas used for the heat treatment under an oxygen atmosphere do not include water, hydrogen, or the like. Alternatively, the purity of the oxygen gas which is introduced into the heat treatment apparatus is preferably 6N (99.9999%) or higher, further preferably 7N (99.99999%) or higher (that is, the impurity concentration in the oxygen gas is 1 ppm or lower, preferably 0.1 ppm or lower).

Alternatively, oxygen may be added to the oxide semiconductor film 716 by ion implantation, ion doping, or the like so that oxygen vacancies that serve as donors are reduced. For example, oxygen made to be plasma with a microwave of 2.45 GHz may be added to the oxide semiconductor film 716.

The conductive films 722 and 723 can be formed in such a manner that a conductive film is formed over the gate insulating film 721 and then is patterned. The conductive films 722 and 723 can be formed using a material similar to that of the conductive films 707 and 708 or the conductive films 714 and 715.

The thickness of each of the conductive films 722 and 723 is 10 to 400 nm, preferably 100 to 200 nm. In this embodiment, after a conductive film with a thickness of 150 nm for the gate electrode is formed by a sputtering method using a tungsten target, the conductive film is processed (patterned) into a desired shape by etching, whereby the conductive films 722 and 723 are formed. Note that a resist mask may be formed by an inkjet method. Formation of the resist mask by an inkjet method needs no photomask; thus, manufacturing cost can be reduced.

Through the above process, the transistor 202 is formed.

Note that a portion where the conductive film 719 and the conductive film 723 overlap with each other with the gate insulating film 721 interposed therebetween corresponds to the capacitor 203.

Although the transistor 202 is described as a single-gate transistor, a multi-gate transistor including a plurality of channel formation regions can be formed when a plurality of gate electrodes which are electrically connected are included when needed.

Note that an insulating film which is in contact with the oxide semiconductor film 716 (in this embodiment, corresponding to the gate insulating film 721) may be formed using an insulating material containing an element that belongs to Group 13 and oxygen. Many of oxide semiconductor materials contain Group 13 elements, and an insulating material containing a Group 13 element works well with oxide semiconductors. With use of such an insulating material containing a Group 13 element for the insulating film in contact with the oxide semiconductor film, an interface with the oxide semiconductor film can keep a favorable state.

An insulating material containing an element that belongs to Group 13 is an insulating material containing one or more elements that belong to Group 13. As the insulating material containing a Group 13 element, a gallium oxide, an aluminum oxide, an aluminum gallium oxide, a gallium aluminum oxide, and the like are given. Here, aluminum gallium oxide refers to a material in which the content of aluminum is larger than that of gallium in atomic percent, and gallium aluminum oxide refers to a material in which the content of gallium is larger than or equal to that of aluminum in atomic percent.

The insulating film in contact with the oxide semiconductor film 716 preferably contains oxygen in a proportion higher than that of the stoichiometry, by heat treatment under an oxygen atmosphere or oxygen doping. The oxygen doping may be performed by ion implantation or ion doping.

By oxygen doping, an insulating film which includes a region where the proportion of oxygen is higher than that of the stoichiometry can be formed. When the insulating film including such a region is in contact with the oxide semiconductor film, oxygen that exists excessively in the insulating film is supplied to the oxide semiconductor film, and oxygen defects in the oxide semiconductor film or at the interface between the oxide semiconductor film and the insulating film is reduced. Thus, the oxide semiconductor film can be formed to an i-type or substantially i-type oxide semiconductor.

Figure 9B:
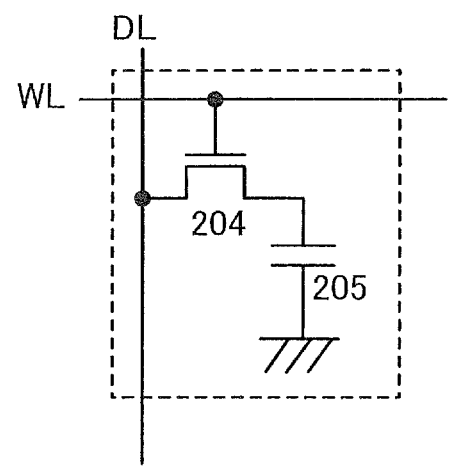

FIG. 9B illustrates another circuit diagram of the memory cell included in the semiconductor device according to one embodiment of the invention.

A memory cell in FIG. 9B includes a transistor 204 and a capacitor 205. A gate electrode of the transistor 204 is connected to a word line WL. One of a source electrode and a drain electrode of the transistor 204 is connected to a data line DL, and the other of the source electrode and the drain electrode thereof is connected to one of electrodes of the capacitor 205. The other electrode of the capacitor 205 is connected to a node to which a fixed potential such as a ground potential is given.

In the memory cell in FIG. 9B, in data writing, the transistor 204 is turned on, so that a potential of a signal including data is given from the data line DL to the one of the electrodes of the capacitor 205 through the transistor 204. The amount of charge accumulated in the capacitor 205 is controlled in accordance with the potentials of the signals, so that data is written to the capacitor 205.

In data holding, the transistor 204 is turned off, so that the charge is held in the capacitor 205. The transistor 204 has a characteristic of extremely small off-state current. Therefore, the charge accumulated in the capacitor 205 is unlikely to leak, and thus, the data can be held for a long period of time as compared to the case where a semiconductor material such as silicon is used for the transistor 204.

At the time of data reading, the transistor 204 is turned on, so that the charge accumulated in the capacitor 205 is taken out via the data line DL. The difference in the amount of charge is read, whereby data can be read.

FIG. 10A illustrates an example of a cross-sectional view of the memory cell in FIG. 9B. The transistor 204 includes conductive films 751 and 752 over a substrate 750 having an insulating surface, a semiconductor film 753 over the conductive films 751 and 752, a conductive film 754 and a conductive film 755 which are connected to the conductive film 751 and the conductive film 752, respectively, an insulating film 756 over the semiconductor film 753, and a conductive film 757 provided in a position overlapping with the semiconductor film 753 over the insulating film 756.

The capacitor 205 includes the conductive film 755 over the substrate 750 having the insulating surface, the insulating film 756 over the conductive film 755, and a conductive film 758 formed in a position overlapping with the conductive film 755 over the insulating film 756.

Note that in the semiconductor device according to one embodiment of the invention, a driver circuit that controls driving of the memory cell may be provided below the memory cell. FIG. 10B illustrates an example of a cross-sectional view of a memory device in which the memory cell and the driver circuit are stacked.

In the memory device in FIG. 10B, a transistor 206 included in the driver circuit includes, over a substrate 760 having an insulating surface, a semiconductor film 761, an insulating film 762 over the semiconductor film 761, a conductive film 763 provided in a position overlapping with the semiconductor film 761 over the insulating film 762, and conductive films 764 and 765 which are connected to the semiconductor film 761. Note that the semiconductor film 761, the insulating film 762, and the conductive film 763 are covered with an insulating film 766. Further, the semiconductor film 761 is connected to the conductive films 764 and 765 in openings formed in the insulating films 762 and 766.

The transistor 204 includes, over the conductive film 764 and the insulating film 766, conductive films 780 and 781 and an insulating film 782 provided between the conductive films 780 and 781. The conductive film 764 is connected to the conductive film 781. Further, the transistor 204 includes, over a layer including the conductive films 780 and 781 and the insulating film 782, a conductive film 771 and a conductive film 772 which are connected to the conductive film 780 and the conductive film 781, respectively, a semiconductor film 773 over the conductive films 771 and 772, a conductive film 774 and a conductive film 775 which are connected to the conductive film 771 and the conductive film 772, respectively, an insulating film 776 over the semiconductor film 773 and the conductive films 774 and 775, and a conductive film 777 provided in a position overlapping with the semiconductor film 773 over the insulating film 776.

The capacitor 205 includes the conductive film 775, the insulating film 776 over the conductive film 775, and a conductive film 783 over the insulating film 776 over the conductive film 775.

This embodiment can be implemented in appropriate combination with Embodiment 1.

(Embodiment 3)

A structure example of an inverter that is one of the semiconductor devices according to one embodiment of the invention is described.

Figure 11:
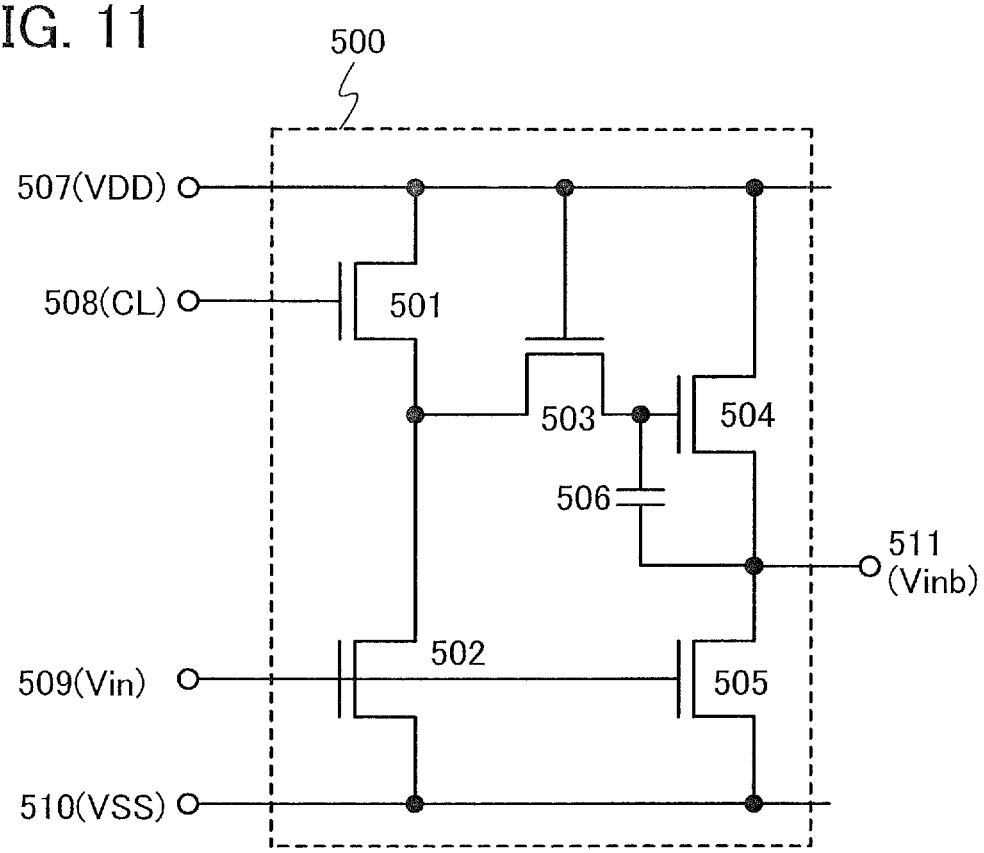
FIG. 11 illustrates a structure of an inverter.

FIG. 11 illustrates an example of an inverter according to one embodiment of the invention. An inverter 500 in FIG. 11 includes a transistor 501, a transistor 502, a transistor 503, a transistor 504, a transistor 505, and a capacitor 506.

A gate electrode of the transistor 501 is connected to a wiring 508; a source electrode of the transistor 501 is connected to a drain electrode of the transistor 502; and a drain electrode of the transistor 501 is connected to a wiring 507. A gate electrode of the transistor 502 is connected to a wiring 509; a source electrode of the transistor 502 is connected to a wiring 510; and the drain electrode of the transistor 502 is connected to the source electrode of the transistor 501. A gate electrode of the transistor 503 is connected to the wiring 507; one of a source electrode and a drain electrode of the transistor 503 is connected to the source electrode of the transistor 501 and the drain electrode of the transistor 502; and the other of the source electrode and the drain electrode of the transistor 503 is connected to a gate electrode of the transistor 504. A source electrode of the transistor 504 is connected to a drain electrode of the transistor 505 and a wiring 511; and a drain electrode of the transistor 504 is connected to the wiring 507. A gate electrode of the transistor 505 is connected to the wiring 509; a source electrode of the transistor 505 is connected to the wiring 510; and the drain electrode of the transistor 505 is connected to the source electrode of the transistor 504 and the wiring 511.

One electrode of the capacitor 506 is connected to the gate of the transistor 504, and the other electrode of the capacitor 506 is connected to the wiring 511.

In the case where the transistors 502 and 505 are n-channel transistors, specifically, a high-level potential VDD is given to the wiring 507, and a low-level potential VSS is given to the wiring 510. A potential CL of a clock signal is given to the wiring 508, and a potential Vin is given to the wiring 509. A potential Vinb that is obtained by inversion of the polarity of the potential Vin is output from the wiring 511.

In the semiconductor device according to one embodiment of the invention, the resistance of conductive films functioning as the source electrode and the drain electrode can be suppressed to be low even when the transistor is miniaturized, whereby large on-state current can be ensured. Accordingly, by applying the structure of the invention to the inverter 500, even when the inverter 500 is miniaturized, high operation speed can be ensured and a current feeding ability can be enhanced.

This embodiment can be implemented in appropriate combination with the other embodiments.

(Embodiment 4)

The semiconductor device according to one embodiment of the invention can be used for display devices, personal computers, or image reproducing devices provided with recording media (typically, devices which reproduce the content of recording media such as digital versatile discs (DVDs) and have displays for displaying the images). Besides, examples of an electronic appliance in which the semiconductor device according to one embodiment of the invention can be used include mobile phones, game machines including portable game machines, portable information terminals, e-book readers, video cameras, digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like. FIGS. 12A to 12E illustrate specific examples of these electronic appliances.

Figure 12A:
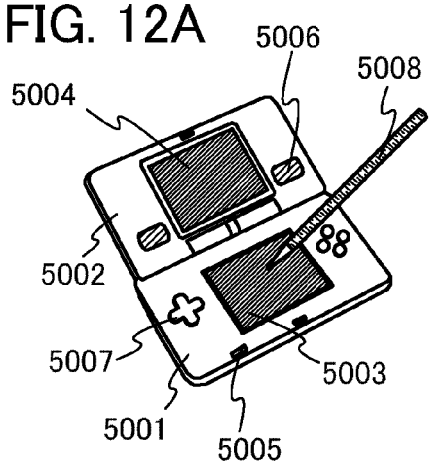
FIGS. 12A to 12E illustrate electronic appliances.

FIG. 12A illustrates a portable game machine including a housing 5001, a housing 5002, a display portion 5003, a display portion 5004, a microphone 5005, speakers 5006, operation keys 5007, a stylus 5008, and the like. With use of the semiconductor device according to one embodiment of the invention in a driver circuit of the portable game machine, a portable game machine that operates at high speed can be provided. Alternatively, with use of the semiconductor device according to one embodiment of the invention, miniaturization of the portable game machine can be achieved. Although the portable game machine in FIG. 12A has the two display portions 5003 and 5004, the number of display portions included in a portable game machine is not limited to this.

Figure 12B:
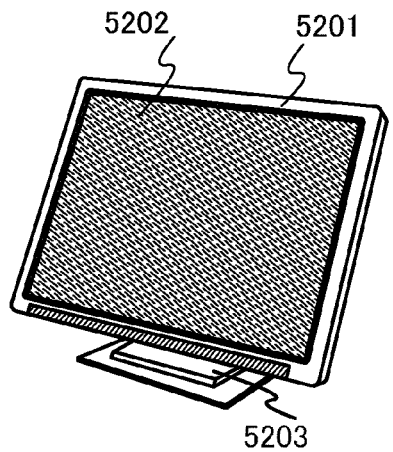

FIG. 12B illustrates a display device including a housing 5201, a display portion 5202, a support base 5203, and the like. With use of the semiconductor device according to one embodiment of the invention in a driver circuit of the display device, a display device that operates at high speed can be provided. Alternatively, with use of the semiconductor device according to one embodiment of the invention, miniaturization of the display device can be achieved. Note that the display device includes, in its category, any display device for displaying information, such as display devices for personal computers, TV broadcast reception, and advertisement.

Figure 12C:
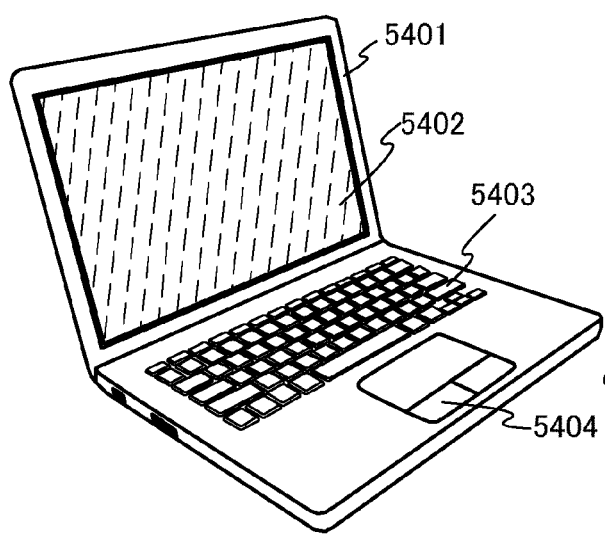

FIG. 12C illustrates a laptop personal computer including a housing 5401, a display portion 5402, a keyboard 5403, a pointing device 5404, and the like. With use of the semiconductor device according to one embodiment of the invention in a driver circuit of the laptop personal computer, a laptop personal computer that operates at high speed can be provided. Alternatively, with use of the semiconductor device according to one embodiment of the invention, miniaturization of the laptop personal computer can be achieved.

Figure 12D:
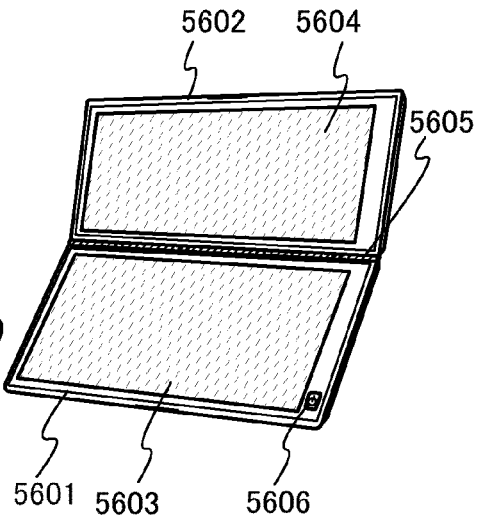

FIG. 12D illustrates a portable information terminal including a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and an angle between the first housing 5601 and the second housing 5602 can be changed with the joint 5605. An image on the first display portion 5603 may be switched depending on the angle between the first housing 5601 and the second housing 5602 at the joint 5605. A semiconductor display device with a position input function may be used as at least one of the first display portion 5603 and the second display portion 5604. Note that the position input function can be added by provision of a touch panel in a semiconductor display device. Alternatively, the position input function can be added by provision of a photoelectric conversion element called a photosensor in a pixel portion of a semiconductor display device. With use of the semiconductor device according to one embodiment of the invention in a driver circuit of the portable information terminal, a portable information terminal that operates at high speed can be provided. Alternatively, with use of the semiconductor device according to one embodiment of the invention, miniaturization of the portable information terminal can be achieved.

Figure 12E:
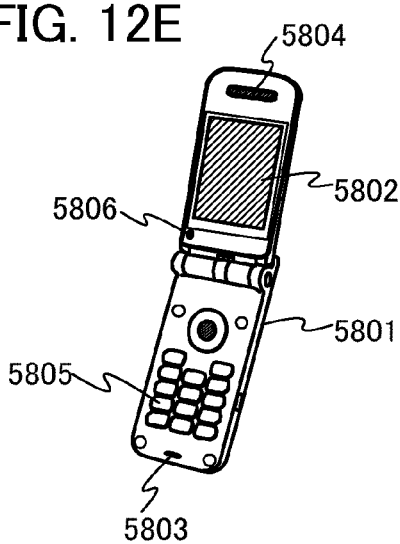

FIG. 12E illustrates a mobile phone including a housing 5801, a display portion 5802, an audio input portion 5803, an audio output portion 5804, operation keys 5805, a light-receiving portion 5806, and the like. Light received in the light-receiving portion 5806 is converted into electrical signals, whereby external images can be loaded. With use of the semiconductor device according to one embodiment of the invention in a driver circuit of the mobile phone, a mobile phone that operates at high speed can be provided. Alternatively, with use of the semiconductor device according to one embodiment of the invention, miniaturization of the mobile phone can be achieved.

This embodiment can be implemented in appropriate combination with the other embodiments.

REFERENCE NUMERALS

101: conductive film, 101e: end portion, 102: conductive film, 102e: end portion, 103: semiconductor film, 104: conductive film, 104e: end portion, 105: conductive film, 105e: end portion, 106: insulating film, 107: conductive film, 107e: end portion, 108: opening, 109: opening, 110: conductive film, 111: conductive film, 112: semiconductor film, 113: semiconductor film, 114: $L_{ov}$ region, 115: $L_{ov}$ region, 116: $L_{off}$ region, 117: $L_{off}$ region, 120: insulating film, 201: transistor, 202: transistor, 203: capacitor, 204: transistor, 205: capacitor, 206: transistor, 500: inverter, 501: transistor, 502: transistor, 503: transistor, 504: transistor, 505: transistor, 506: capacitor, 507: wiring, 508: wiring, 509: wiring, 510: wiring, 511: wiring, 700: substrate, 701: insulating film, 702: semiconductor film, 703: gate insulating film, 704: impurity region, 705: mask, 706: opening, 707: conductive film, 708: conductive film, 709: impurity region, 710: channel formation region, 711: impurity region, 712: insulating film, 713: insulating film, 714: conductive film, 715: conductive film, 716: oxide semiconductor film, 717: opening, 718: opening, 719: conductive film, 720: conductive film, 721: gate insulating film, 722: conductive film, 723: conductive film, 750: substrate, 751: conductive film, 752: conductive film, 753: semiconductor film, 754: conductive film, 755: conductive film, 756: insulating film, 757: conductive film, 758: conductive film, 760: substrate, 761: semiconductor film, 762: insulating film, 763: conductive film, 764: conductive film, 765: conductive film, 766: insulating film, 771: conductive film, 772: conductive film, 773: semiconductor film, 774: conductive film, 775: conductive film, 776: insulating film, 777: conductive film, 780: conductive film, 781: conductive film, 782: insulating film, 783: conductive film, 5001: housing, 5002: housing, 5003: display portion, 5004: display portion, 5005: microphone, 5006: speaker, 5007: operation key, 5008: stylus, 5201: housing, 5202: display portion. 5203: support base, 5401: housing, 5402: display portion, 5403: keyboard, 5404: pointing device, 5601: housing, 5602: housing, 5603: display portion, 5604: display portion, 5605: joint, 5606: operation key, 5801: housing, 5802: display portion, 5803: audio input portion, 5804: audio output portion, 5805: operation key, 5806: light-receiving portion.

This application is based on Japanese Patent Application serial no. 2011-207429 filed with Japan Patent Office on Sep. 22, 2011, the entire contents of which are hereby incorporated by reference.

The invention claimed is:

1. A semiconductor device comprising:
  a first conductive film and a second conductive film over an insulating surface;
  an oxide semiconductor film over and in contact with the first conductive film and the second conductive film;
  a third conductive film over the oxide semiconductor film, the third conductive film being in contact with the first conductive film;

a fourth conductive film over the oxide semiconductor film, the fourth conductive film being in contact with the second conductive film;

an insulating film over the oxide semiconductor film, the third conductive film, and the fourth conductive film; and a fifth conductive film over the insulating film, wherein the fifth conductive film overlaps the first conductive film and the second conductive film, and wherein the fifth conductive film does not overlap the third conductive film and the fourth conductive film.

2. The semiconductor device according to claim 1,
wherein a length of the oxide semiconductor film in a channel width direction is smaller than a length of each of the first conductive film and the second conductive film in the channel width direction, and
wherein the length of the oxide semiconductor film in the channel width direction is larger than a length of each of the third conductive film and the fourth conductive film in the channel width direction.

3. The semiconductor device according to claim 1, wherein a gap between the third conductive film and the fourth conductive film is longer than a gap between the first conductive film and the second conductive film.

4. The semiconductor device according to claim 1,
wherein the third conductive film is provided in contact with an end portion of the first conductive film, and
wherein the fourth conductive film is provided in contact with an end portion of the second conductive film.

5. The semiconductor device according to claim 1, wherein each of the first conductive film and the second conductive film has a thickness of greater than or equal to 10 nm and less than or equal to 300 nm.

6. The semiconductor device according to claim 1, wherein the oxide semiconductor film comprises indium, gallium, and zinc.

7. The semiconductor device according to claim 1, wherein the oxide semiconductor film comprises indium, tin, and zinc.

8. A semiconductor device comprising:
a first conductive film and a second conductive film over an insulating surface;
an oxide semiconductor film over and in contact with the first conductive film and the second conductive film, the oxide semiconductor film having a first opening and a second opening;
a third conductive film over the oxide semiconductor film, the third conductive film being in contact with the first conductive film through the first opening;
a fourth conductive film over the oxide semiconductor film, the fourth conductive film being in contact with the second conductive film through the second opening;
an insulating film over the oxide semiconductor film, the third conductive film, and the fourth conductive film; and
a fifth conductive film over the insulating film,
wherein the fifth conductive film overlaps the first conductive film and the second conductive film, and
wherein the fifth conductive film does not overlap the third conductive film and the fourth conductive film.

9. The semiconductor device according to claim 8,
wherein a length of the oxide semiconductor film in a channel width direction is smaller than a length of each of the first conductive film and the second conductive film in the channel width direction, and
wherein the length of the oxide semiconductor film in the channel width direction is larger than a length of each of the third conductive film and the fourth conductive film in the channel width direction.

10. The semiconductor device according to claim 8, wherein a gap between the third conductive film and the fourth conductive film is longer than a gap between the first conductive film and the second conductive film.

11. The semiconductor device according to claim 8,
wherein the third conductive film is provided in contact with an end portion of the first conductive film, and
wherein the fourth conductive film is provided in contact with an end portion of the second conductive film.

12. The semiconductor device according to claim 8, wherein each of the first conductive film and the second conductive film has a thickness of greater than or equal to 10 nm and less than or equal to 300 nm.

13. The semiconductor device according to claim 8, wherein the oxide semiconductor film comprises indium, zinc, and one of gallium and tin.

* * * * *